United States Patent [19]

Johnson et al.

[11] 4,369,510

[45] Jan. 18, 1983

[54] SOFT ERROR REWRITE CONTROL SYSTEM

[75] Inventors: Robert B. Johnson, Billerica; Chester M. Nibby, Jr., Peabody, both of Mass.

[73] Assignee: Honeywell Information Systems Inc., Waltham, Mass.

[21] Appl. No.: 172,485

[22] Filed: Jul. 25, 1980

[51] Int. Cl.³ .............................................. G06F 11/10
[52] U.S. Cl. ...................................... 371/13; 364/900; 371/38
[58] Field of Search .................... 371/13, 38; 364/200, 364/900; 365/200, 201, 222

[56] References Cited

U.S. PATENT DOCUMENTS

| | | | |
|---|---|---|---|
| 4,072,853 | 2/1978 | Barlow et al. | 371/38 |
| 4,175,692 | 11/1979 | Watanabe | 371/38 |
| 4,183,096 | 1/1980 | Cenker et al. | 365/222 |
| 4,216,541 | 8/1980 | Clover et al. | 371/38 |
| 4,255,808 | 3/1981 | Schaber | 371/38 |

OTHER PUBLICATIONS

Christensen and Pattin, Jr., Stuck-Track Error Correction, IBM Technical Disclosure Bulletin, vol. 13, No. 7, Dec. 1970, pp. 1844-1846.

Primary Examiner—Charles E. Atkinson
Attorney, Agent, or Firm—Faith F. Driscoll; Nicholas Prasinos

[57] ABSTRACT

Refresh and initialize counter circuits included within a dynamic memory system are supplemented with additional counter control circuits for synchronizing them from the same timing source which drives the refresh and initialize counter circuits. The counter control circuits count in accordance with modulus one less than a maximum count so as to generate a sequence of counts over a corresponding number of cycles of operation for selection of row and column addresses which enable the information stored in each location of the memory system to be read out, corrected for single bit errors and rewritten back thereby rendering the system less susceptible to soft errors such as those produced by alpha particles.

40 Claims, 11 Drawing Figures

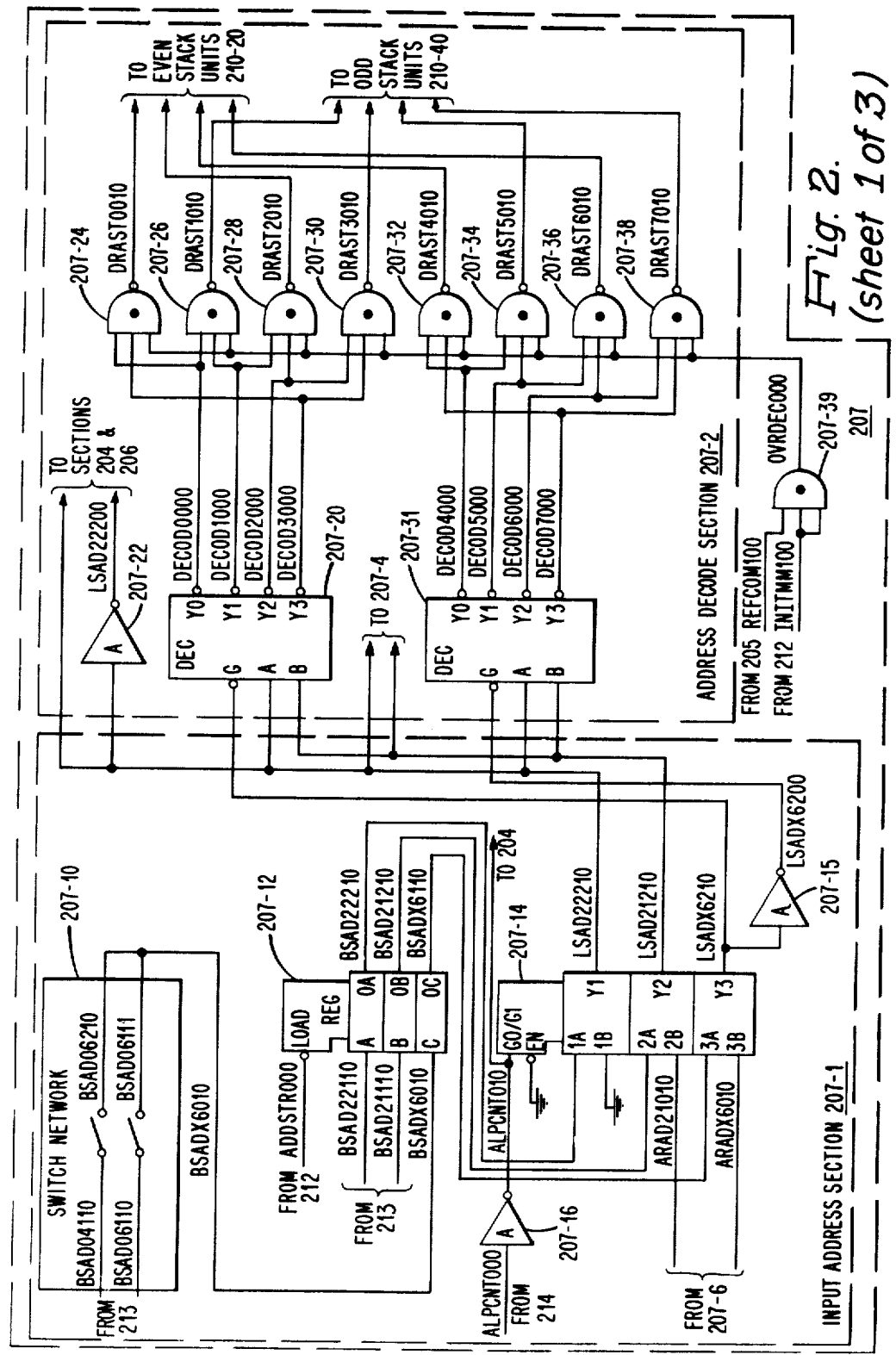
Fig. 2. (sheet 1 of 3)

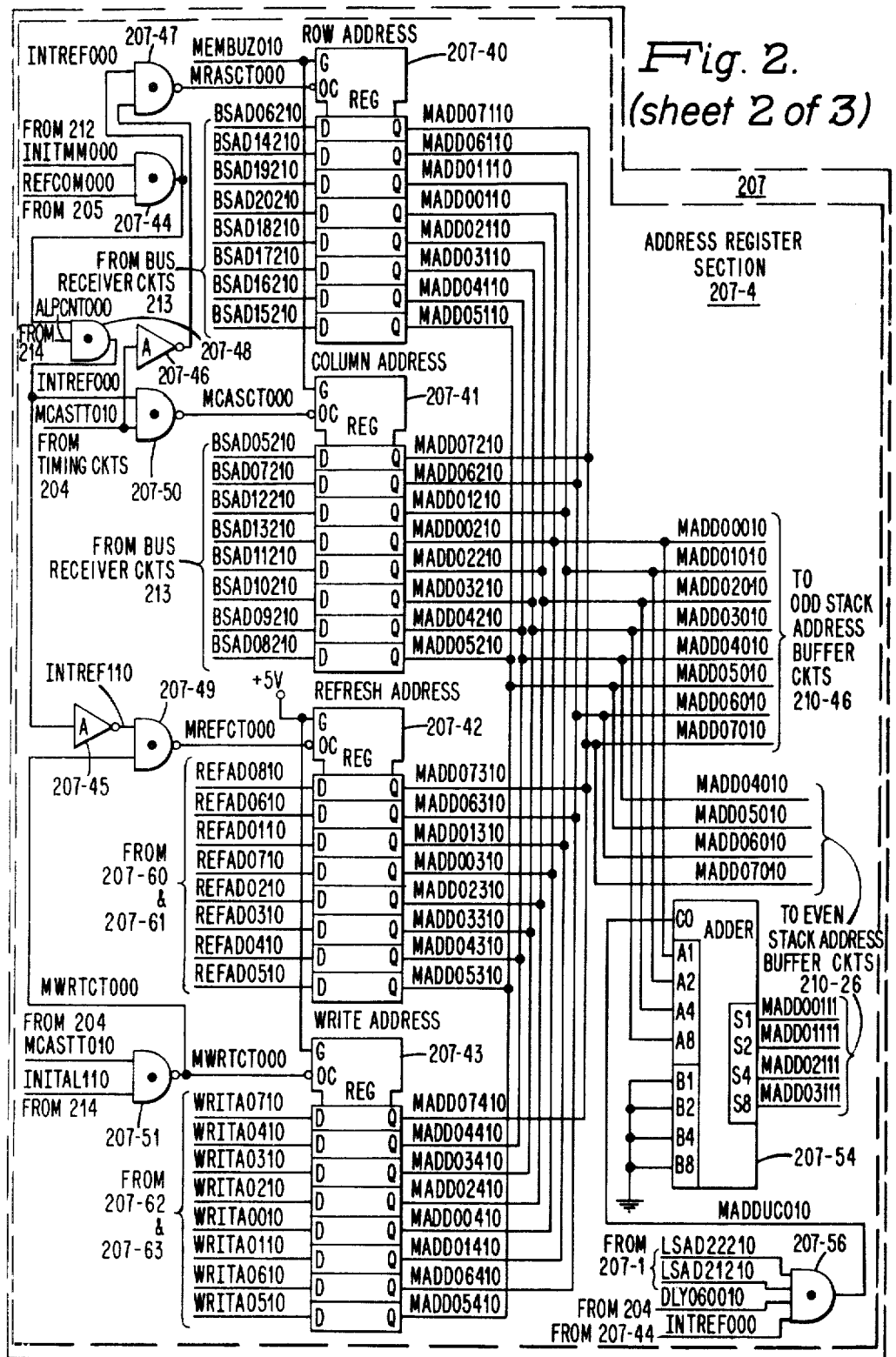
Fig. 2. (sheet 2 of 3)

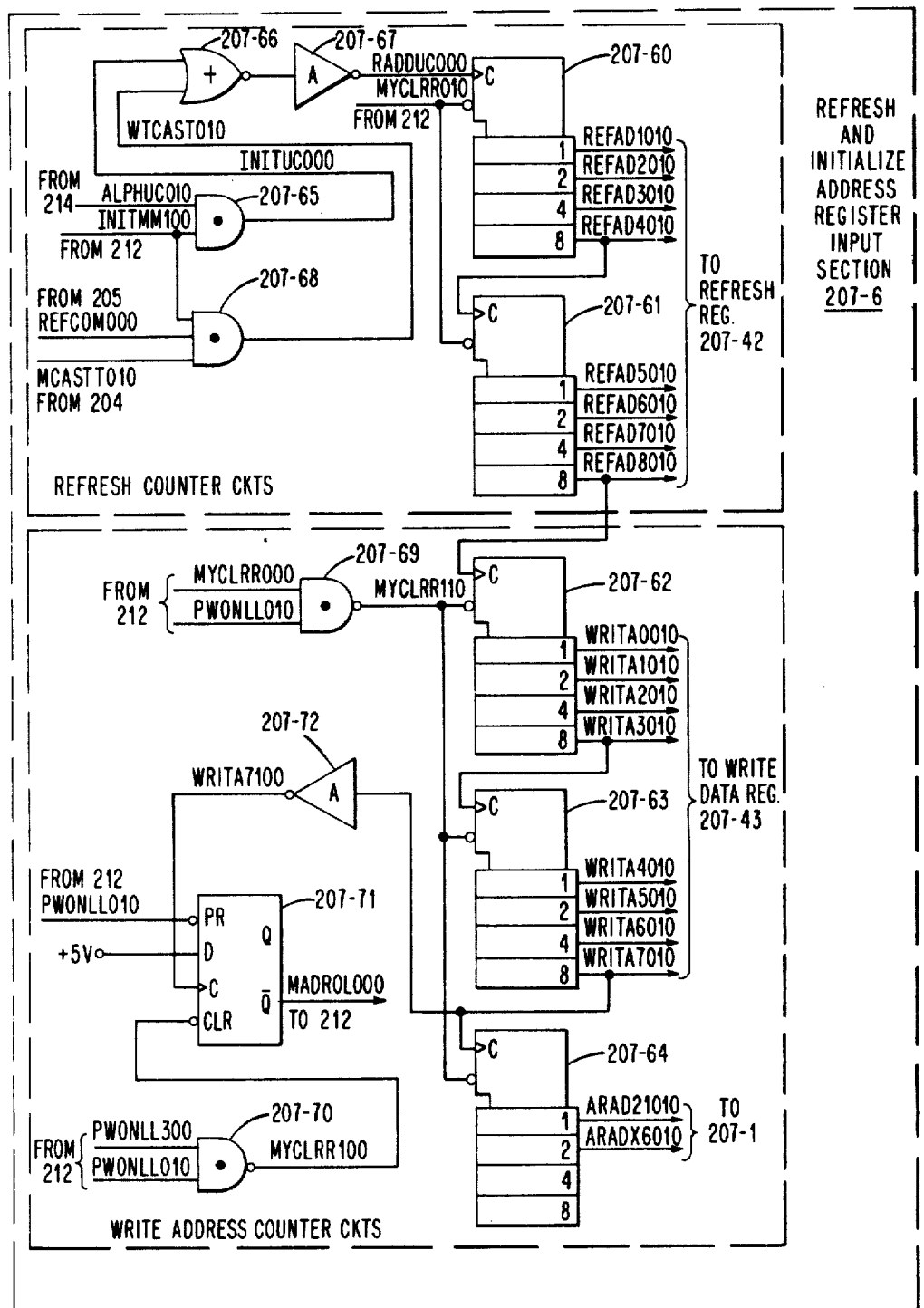
Fig. 2. (sheet 3 of 3)

SOFT ERROR REWRITE CONTROL SYSTEM

BACKGROUND OF THE INVENTION

1. Field of Use

This invention relates to dynamic memory systems and more particularly to improving the reliability of such systems.

2. Prior Art

Recently, manufacturers of dynamic random access memory chips have noted that high density memory chips lack immunity of soft errors resulting from ionizing alpha particles. To overcome this problem, some manufacturers have improved the structures of the chips so as to provide a high degree of immunity to soft errors. While this approach reduces the likeliness of such soft errors, such errors still can occur which can give rise to uncorrectable error conditions.

Other manufacturers have proposed certain systems design alternatives. These include error correction, rewriting the corrected word to prevent error accumulation, periodic memory purging and systems redundancy. The soft error problems and the design alternatives are set forth in the publication "Memory System Design Seminar" by Intel Corporation, Copyright 1979.

It will be appreciated that while the above alternatives have been suggested, there appears to be no memory systems which have the ability to protect against soft errors.

Accordingly, it is a primary object of the present invention to provide a memory system with the capability of protecting against soft errors.

It is a further object of the present invention to provide a soft error protection capability by adding a minimum of additional apparatus to the memory system.

SUMMARY OF THE INVENTION

The above objects are achieved in a preferred embodiment of the present invention by including additional apparatus in a dynamic memory system which in conjunction with the refresh initialization circuits and error detection and correction (EDAC) circuits of the dynamic memory system initiates rewrite cycles of operation at a predetermined rate for writing corrected versions of the information read out from each location. The additional apparatus includes counter control circuits which are synchronized from the same timing source which synchronizes the operation of the refresh and initialize address counter circuits. The counter control circuits count with a modulus one less than a maximum count generated by such circuits enable the generation of a sequence of counts which select different combinations of row and column addresses for rewriting all of the locations with error free information during a corresponding number of cycles of operation at the predetermined rate.

The predetermined rate is selected to be much slower than the refresh rate so as to minimize interference with normal memory operations. By utilizing the existing refresh and initialize circuits and data paths, the amount of additional circuits is kept to a minimum.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIG. 2 discloses in greater detail the circuits of block 207 of FIG. 1.

MEMORY SUBSYSTEM INTERFACE

Figure 1:
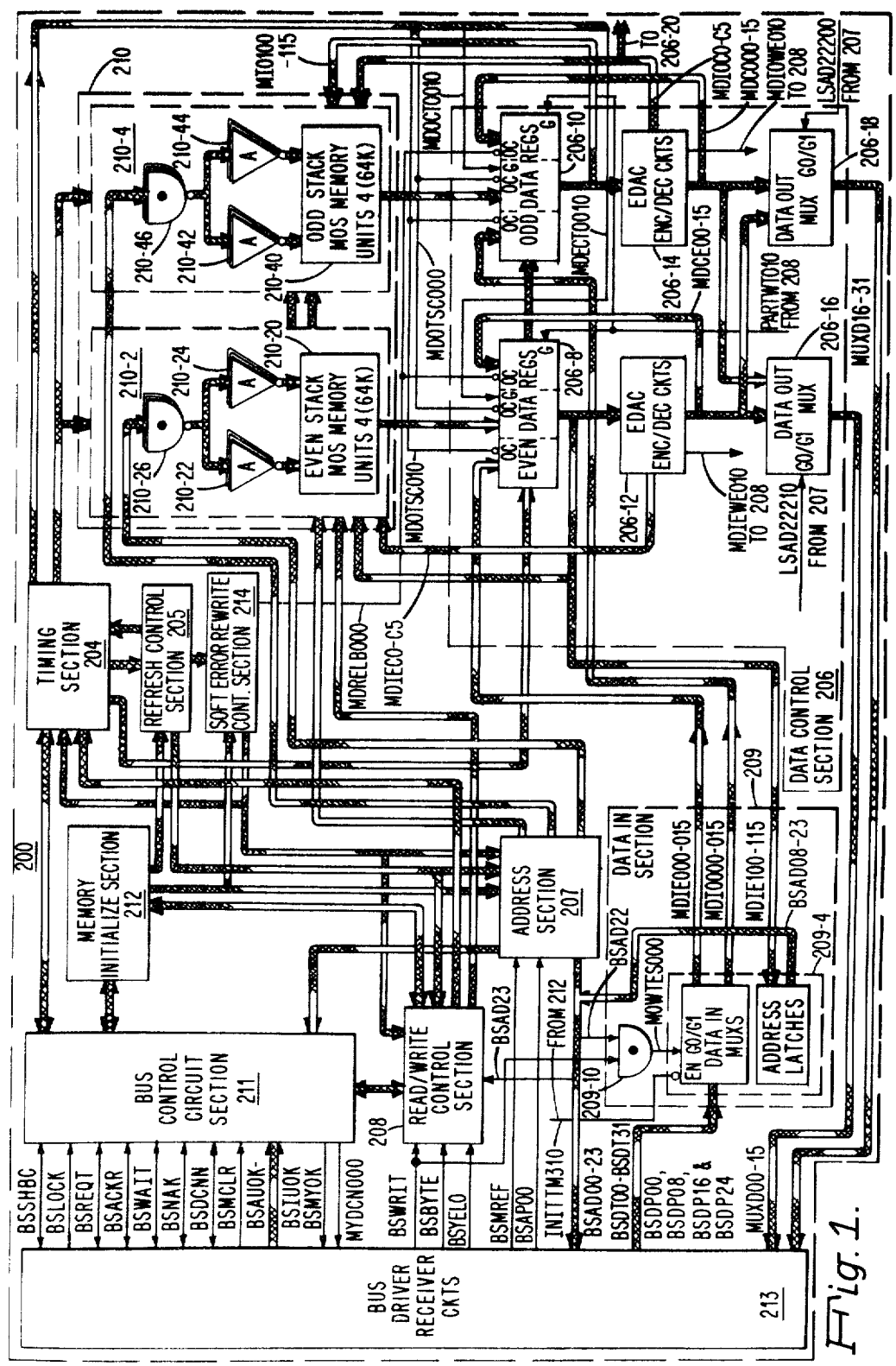
FIG. 1 is a block diagram of a dynamic memory system which incorporates the apparatus of the present invention.

Before describing the controller of FIG. 1, it is seen that there are a number of lines which constitute the interface between the controller and a bus. As shown, the interface lines include a number of address lines (BSAD00-23, BSAP00), two sets of data lines (BSDT00-15, BSDP00, BSDP08) and (BSDT16-31, BSDP16, BSDP24), a number of control lines (BSMREF-BSMCLR), a number of timing lines (BSREQT-BSNAKR), and a number of tie breaking network lines (BSAUOK-BSIUOK, BSMYOK).

The description of the above interface lines are given in greater detail in the section to follow.

| MEMORY SUBSYSTEM INTERFACE LINES | |
|---|---|
| Designation | Description |
| | Address Lines |
| BSAD00-BSAD23 | The bus address lines constitute a twenty-four bit wide path used in conjunction with the bus memory reference line BSMREF to transfer a 24-bit address to controller 200 or a 16-bit identifier from controller 200 to the bus (for receipt by a slave unit). When used for memory addressing, the signals applied to lines BSAD00-BSAD03 select a particular 512K word module, the signals applied to lines BSAD04-OBBSAD22 select one of the 512K words in the module while the signal applied to line BSAD23 selects one of the bytes within the selected word (i.e., BSAD23=1=right byte; BSAD23=0=left byte). When used for identification, lines BSAD00-BSAD07 are not used. The lines BSAD08-BSAD23 carry the identification of the receiving unit as transmitted to controller 200 during the previous memory read request. |
| BSAP00 | The bus address parity line is a bidirectional line which provides an odd parity signal for the address signals applied to lines BSAD00-BSAD07. |
| | Data Lines |

MEMORY SUBSYSTEM INTERFACE LINES

| Designation | Description |
|---|---|
| BSDT00-BSDT15, BSDT16-BSDT31 | The sets of bus data lines constitute 32-bit or two word wide bidirectional path for transferring data or identification information between controller 200 and the bus as a function of the cycle of operation being performed. During a write cycle of operation, the bus data lines transfer information to be written into memory at the location specified by the address signals applied to lines BSAD00-BSAD23. During the first half of a read cycle of operation, the data lines BSDT00-BSDT15 transfer identification information (channel number) to the controller 200. During the second half of the read cycle, the data lines transfer the information read from memory. |
| BSDP00, BSDP08, BSDP16, BSDP24 | The bus data parity lines are two sets of bidirectional lines which provide odd parity signals coded as follows: BSDP00=odd parity for signals applied to lines BSDT00-BSDT07 (left byte); BSDP08=odd parity for signals applied to lines BSDT08-BSDT15 (right byte); BSDP16=odd parity for signals applied to lines BSDT16-BSDT23; and BSDP24=odd parity signals applied to lines BSDT24-BSDT31. |
| | Control Lines |
| BSMREF | The bus memory reference lines extends from the bus to the memory controller 200. When set to a true state, this line signals the controller 200 that the lines BSAD00-BSAD23 contain a complete memory controller address and that it is performing a write or read operation upon the specified location. When reset to a false state, the line signals controller 200 that the lines BSAD00-BSAD23 contain information directed to another unit and not controller 200. |
| BSWRIT | The bus write line extends from the bus to the memory controller 200. This line when set to a true state, in conjunction with line BSMREF being true, signals controller 200 to perform a write cycle of operation. When reset to a false state, this line, in conjunction with line BSMREF being true, signals controller 200 to perform a read cycle of operation. |
| BSBYTE | The bus byte line extends from the bus to controller 200. This line, when set to a true state, signals controller 200 that it is to perform a byte operation rather than a word operation. |
| BSLOCK | The bus lock line extends from the bus to controller 200. When set to a true state, this line signals controller 200 of a request to perform a test or change the status of a memory lock flip-flop included within the controller 200. |
| BSSHBC | The bus second half bus cycle line is used to signal a unit that the current information applied to the bus by controller 200 is the information requested by a previous read request. In this case, both controller 200 and the unit receiving the information are busy to all units from the start of the initiation cycle until controller 200 completes the transfer. |

MEMORY SUBSYSTEM INTERFACE LINES

| Designation | Description |
|---|---|
| | This line is used in conjunction with the BSLOCK line to set or reset its memory lock flip-flop. When a unit is requesting to read or write and line BSLOCK is true, the line BSSHBC, when true, signals controller 200 to reset its lock flip-flop. When in a false state, it signals controller 200 to test and set its lock flip-flop. |
| BSMCLR | The bus master clear line extends from the bus to controller 200. When this line is set to a true state, it causes the controller 200 to clear to zeros certain bus circuits within controller 200. |
| BSYELO | The bus yellow line is a bidirectional line which designates a soft error condition. When set to a true state during the second half of a bus cycle in response to a read command, it indicates that the accompanied transferred information has been successfully corrected. When set to a true state during a memory read request, this line indicates that the read request is to be interpreted as a diagnostic command. |
| | Bus Handshake/Timing Lines |
| BSREQT | The bus request line is a bidirectional line which extends between the bus and controller 200. When set to a true state, it signals the controller 200 that another unit is requesting a bus cycle. When reset to a false state, it signals controller 200 that there is no bus pending bus request. This line is forced to a true state by controller 200 to request a read second half bus cycle. |
| BSDCNN | The data cycle line is a bidirectional line which extends between the bus and controller 200. When forced to a true state, the line signals the controller 200 that a unit was granted a requested bus cycle and placed information on the bus for another unit. The controller 200 forces the line to a true state to signal that it is transmitting requested data back to a unit. Prior to this, controller 200 had requested and been granted a bus cycle. |
| BSACKR | The bus acknowledge line is a bidirectional line which extends between the bus and controller 200. When set to a binary ONE by controller 200, the line signals that it is accepting a bus transfer during a read first half bus cycle or write cycle. During a read second half bus cycle, this line when set to a binary ONE by the unit which originated the request signals controller 200 of its acceptance of a transfer. |
| BSWAIT | The bus wait line is a bidirectional line which extends between the bus and controller 200. When set to a true or binary ONE state by controller 200, it signals a requesting unit that the controller cannot accept a transfer at this time. Thereafter, the unit will initiate successive retries until the controller 200 acknowledges the transfer. The controller 200 sets the BSWAIT line true under the following conditions: 1. It is busy performing an internal read or write cycle of operation. 2. It is requesting a read second |

-continued
MEMORY SUBSYSTEM INTERFACE LINES

| Designation | Description |
|---|---|
| | half bus cycle.<br>3. It is anticipating a refresh operation.<br>4. It is performing a refresh operation.<br>5. It is busy when placed in an initialize mode.<br>6. It is busy performing a soft error rewrite cycle.<br>When the BSWAIT line is set to a true or binary ONE state by a unit, this signals the controller 200 that the data is not being accepted by the requesting unit and to terminate its present bus cycle of operation. |
| BSNAKR | The bus negative acknowledge line is a bidirectional line which extends between the bus and controller 200. When this line is set to a true or binary ONE state by controller 200, it signals that it is refusing a specified transfer. The controller 200 sets line BSNAKR to a true state as follows:<br>1. Memory lock flip-flop is set to a binary ONE, and<br>2. The request is to test and set the lock flip-flop (BSLOCK true and BSSHBC false).<br>In all other cases, when the memory lock flip-flop is set, controller 200 generates a response via the BSACKR line or the BSWAIT line or generates no response.<br>When the BSNAKR line is forced true by a unit, this signals controller 200 that the data is not accepted by the unit and to terminate its cycle of operation. |
| | Tie Breaking Control Lines |
| BSAUOK-BSIUOK | The tie breaking network lines extend from the bus to controller 200. These lines signal controller 200 whether units of higher priority have made bus requests. When all the signals on these lines are binary ONES, this signals controller 200 that is has been granted a bus cycle at which time it is able to force the BSDCNN line to a binary ONE. When any one of the signals on the lines is a binary ZERO, this signals controller 200 that it has not been granted a bus cycle and is inhibited from forcing line BSDCNN to a binary ONE. |
| BSMYOK | The tie breaking network line extends from controller 200 to the bus. Controller 200 forces this line to a false or binary ZERO state to signal other units of lower priority of a bus request. |

GENERAL DESCRIPTION OF THE SYSTEM OF FIG. 1

FIG. 1 shows a preferred embodiment of a memory controller 200 which is constructed using the principles of the present invention. Referring to FIG. 1, it is seen that the controller 200 controls the two 256K word memory module units 210-2 and 210-4 of memory section 210. The module units of blocks 210-2 and 210-4 include high speed MOS random access memory integrated circuits corresponding to blocks 210-20 and 210-40, and address buffer circuits corresponding to blocks 210-22 through 210-26 and 210-42 through 210-46. Each 256K memory unit is constructed from 64K word by 1-bit dynamic MOS RAM chips illustrated in greater detail in FIG. 7. More specifically, referring to FIG. 7, it is seen that each 256K by 22-bit memory module includes 88, 65,534 (64K) word by 1-bit chips. Within each chip there are a number of storage arrays organized in a matrix of 256 rows by 256 columns of storage cells.

The controller 200 includes those circuits required to generate memory timing signals, perform refresh operations, rewrite control operations, data transfer operations, address distribution and decoding operations and bus interface operations. Such circuits are included as part of the different sections of FIG. 1.

The sections include a timing section 204, a refresh control section 205, a soft error rewrite control section 214, a data control section 206, an address section 207, a read/write control section 208, a data in section 209, a bus control circuit section 211, a memory initialize circuit section 212, and bus driver/receiver circuit section 213.

The bus control section 211 includes the logic circuits which generate signals for generating and accepting bus cycle requests for single and double word operations. As seen from FIG. 1, these circuits as well as the circuits of the other sections are connected to a bus via the driver/receiver circuits of section 213 which were conventional in design. The section 211 includes the tie breaking network circuits which resolve requests priority on the basis of a unit's physical position on the bus. The memory controller, located at the left most or bottom position of the bus, is assigned the highest priority while a central processing unit (CPU), located at the highest most or top position of the bus is assigned the lowest priority. For further information regarding bus operation, reference may be made to U.S. Pat. No. 4,000,485 which issued Dec. 28, 1976.

Figure 3:
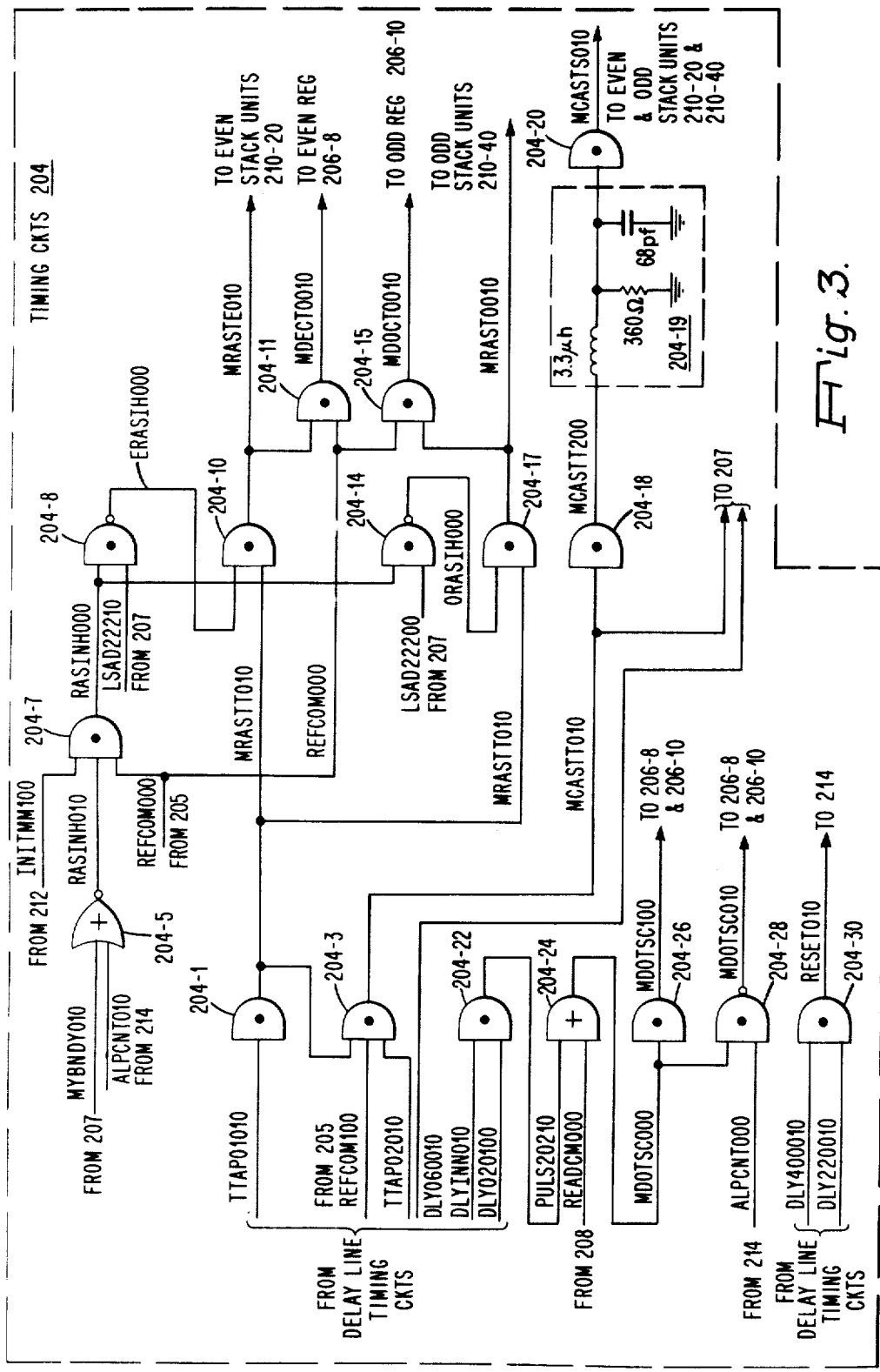
FIG. 3 discloses in greater detail the timing circuits of block 204 of FIG. 1.

The timing section 204, shown in detail in FIG. 3, includes circuits which generate the required sequence of timing signals from memory read and write cycles of operation. As seen from FIG. 1, this section transmits and receives signals to and from sections 205, 206, 207, 208, 211 and 214.

The address section 207, shown in greater detail in FIGS. 2a through 2c, includes circuits which decode, generate and distribute address signals required for refresh operations, initialization and read/write selection. The section 207 receives address signals from lines BSAD08-BSAD23 and address lines BSAD00-BSAD07 and BSAP00 in addition to the memory reference control signal from the BSMREF line. Additionally, section 207 receives control and timing signals from sections 204, 212 and 205.

The memory initialization section 212 includes circuits, conventional in design, for clearing the memory subsystem circuits to initial or predetermined state.

The read/write control section 208 includes register and control logic circuits, conventional in design. The register circuits receive and store signals corresponding to the states of the BSWRIT, BSBYTE and the address line BSAD23. The control circuits decode the signals from the register circuits and generate signals which are applied to sections 204, 207 and 210 for establishing whether the subsystem is to perform the read, write or read followed by a write cycle of operation (i.e., for a byte command).

The refresh section 205 includes the circuits for periodically refreshing the contents of the memory. Section 205 receives timing and control signals from section 204 and provides refresh command control signals to sections 204, 207, 208 and 212. For further details, reference may be made to U.S. Pat. No. 4,185,323 which discloses circuits for generating refresh command (REFCOM) signals.

The data in section 209 circuits of block 209-4 include a pair of multiplexer circuits and an address register which is connected to receive signals from section 206.

The multiplexer circuits, conventional in design, receive data words from the two sets of bus lines BSDT00-15 and BSDT16-31 and apply the appropriate words via the sets of output lines MDIE000-015 and MDIO000-015 to the correct memory modules during a write cycle of operation. That is, multiplexer circuits are selectively enabled by signal MOWTES000 generated by an AND gate 209-10 when initialize signal INITTM310 from 212 is a binary ZERO (i.e., not in an initialize mode). The AND gate 209-10 generates signal MOWTES000 as a function of bus address bit 22 (i.e., signal BSAD22) and whether the controller is doing a write operation (i.e., signal BSWRIT). During a write operation, signal MOWTES000 selects the correct data word (i.e., the word applied to bus lines BSDT00-15 or BSDT16-31) to be applied to the correct memory unit. This enables a write operation to start on any word boundary.

During a read operation, the multiplexer circuits are conditioned to apply the module identification information received from the bus lines BSDT00-15 back to the address bus lines BSAD08-23. This is done by loading the signals applied to lines BSDT00-15 into the even data registers 206-8 of section 206. This, in turn, causes the address register latches of block 209-4 to be with the module identification information transmitted via the bus lines BSDT00-15. Since this is not pertinent to an understanding of the present invention, it will not be further discussed herein.

The data control section 206 includes three tristate operated data registers 206-8 and 206-10 and multiplexer circuits 206-16 and 206-18 with associated control circuits which enable data to be written into and/or read from the even and odd memory units 210-20 and 210-40 of section 210. For example, during a double wide read cycle operation, operand or instruction signals are read out from the units 210-20 and 210-40 into the even and odd output registers 206-8 and 206-10. During a write cycle of operation, the byte operand signals are loaded into the leftmost section of the pair of registers 206-8 and 206-10 from the bus via section 209-4 and written into the odd or even unit of section 210.

The controller 200 includes error detection and correction (EDAC) apparatus wherein each word contains 16 data bits and 6 check bits used to detect and correct single bit errors in the data words and detect and signal without correction, double bit errors in the data word. The EDAC apparatus includes two sets of EDAC encoder/decoder circuits 206-12 and 206-14. These circuits may take the form of those circuits disclosed in U.S. Pat. No. 4,072,853 which issued Feb. 7, 1978. Additionally, the section 206 enables a return of identification information received from the data lines BSDT00-15 and stored in register 209-4 via the address lines BSAD08-23.

In accordance with the teachings of the present invention, the soft error rewrite control section 214 includes circuits for periodically accessing each of the locations within the memory section 210 for reading out and rewriting back into these locations corrected information so as to render the memory 210 less susceptible to soft errors produced by alpha particles or other system disturbances. As shown from FIG. 1, section 214 receives control signals from sections 205, 212 and 213. The section provides control signals to sections 204, 206 and 207, as shown.

Pertinent portions of the above sections will be now discussed in greater detail with reference to FIGS. 2a through 7.

DETAILED DESCRIPTION OF CONTROLLER SECTIONS

Only those sections which are believed necessary to an understanding of the present invention are described herein. For further information regarding the remaining sections, reference may be made to the related patent applications or to U.S. Pat. No. 4,185,323.

Section 204 and Section 206

FIG. 3 illustrates in greater detail, the timing circuits of section 204. The circuits receive input timing pulse signals TTAP01010 and TTAP02010 from delay line timing generator circuits, not shown, conventional in design. Such circuits may take the form of the timing generator circuits shown in U.S. Pat. No. 4,185,323. The timing generator circuits generate a series of timing pulses via a pair of series connected 200 nanosecond delay lines in response to the signal MYACKR10 being switched to a binary ONE. These pulses in conjunction with the circuits of block 204 establish the timing for the remaining sections during a memory cycle of operation.

Additionally, the circuits of block 204 receive a boundary signal MYBNDY010, address signals LSAD22200 and LSAD22210 from section 207 and soft error rewrite control signal ALPCNT010 from section 214. Also, section 212 applies an initialize signal INITMM100 to section 204. The signals MYBNDY010 and ALPCNT010 are applied to a NOR gate 204-5 each of which force signal RASINH010 to a binary ZERO when forced to a binary ONE. The series connected AND gate 204-7 logically combines initialize signal INITMM100, refresh command signal REFCOM100 generated by circuits within section 205, not shown, to produce signal RASINH000. A NAND gate 204-8 combines signals RASINH000 and address signal LSAD22210 to produce an even row strobe inhibit signal ERASIH000. The signal is applied to an AND gate 204-10 for combining with a timing signal MRASTT010 derived from signal TTAP01010 via an AND gate 204-1. The result output signal MRASTE010 is applied to the RAS timing input of the even stack units 210-20.

A NAND gate 204-14 combines signals RASINH010 and LSAD22200 to produce an odd row inhibit signal ORASIH000. This signal is combined in an AND gate 204-17 with timing signal MRASTT010 to generate row timing signal MRAST0010. This signal is applied to the RAS timing input of the odd stack units 210-40.

As seen from FIG. 3, an AND gate 204-11 applies a timing signal MDECT0010 to a G input terminal of the middle section of even data register 206-8 in the absence of a refresh command (i.e., signal REFCOM000=1). Similarly, an AND gate 204-15 applies a timing signal MDOCT0010 to a G input terminal of the middle section of odd data register 206-10. The delay network 204-19 which connects in series with AND gates 204-3, 204-18 and 204-20 generate timing signal MCASTS010.

The signal MCASTS010 is applied to the CAS timing input of the even and odd stack units 210-20 and 210-40.

The even and odd data registers 206-8 and 206-10 are tristate operated. More specifically, the registers are constructed from D type transparent latch circuits such as those designated SN74S373 manufactured by Texas Instruments Incorporated. The register circuits are transparent meaning that while the signal applied to the G input terminal is a binary ONE, the signals at the Q output terminals follow the signals applied to the D input terminals. That is, where the signal applied to the G input terminal goes low, the signal at Q output terminal latches.

The output terminals of registers 206-8 and 206-10 are connected in common in a wired OR arrangement for enabling the multiplexing of the pair of data word signals. Such multiplexing is accomplished by controlling the states of the signals MDOTSC000, MDOTSC010 and MDRELB000 applied to the output control (OC) input terminals of the different sections of registers 206-8 and 206-10 shown in FIG. 1. This operation is independent of the latching action of the register flip-flops which takes place in response to the signals applied to the G input terminals.

The series connected group of gates 204-22 through 204-28 control the states of signals MDOTSC100 and MDOTSC010. The AND gate 204-22 receives timing signals DLYINN010 and DLY020100 at the beginning of a read or write cycle for enabling the storage of identification information from the bus. Since this is not pertinent to an understanding of the present invention, signal PULS20210 can be considered to be at a binary ZERO state. During a read operation, read command signal READCM000 is forced to a binary ZERO which causes AND gate 204-26 to force signal MDOTSC100 to a binary ZERO and NAND gate 204-28 to force signal MDOTSC010 to a binary ONE.

The signal MDOTSC100, when a binary ZERO, enables the middle sections of registers 206-8 and 206-10 to apply their contents to their output terminals. The signal MDOTSC010 when a binary ONE, inhibits the right most sections of registers 206-8 and 206-10 from applying their contents to their output terminals. During a write cycle, when read command signal READCM000 is forced to a binary ONE, AND gate 204-26 forces signal MDOTSC100 to a binary ONE while NAND gate 204-28 forces signal MODOTSC010 to a binary ZERO when signal ALPCNT000 is a binary ONE. This produces the opposite result to that described. That is, signal MDOTSC100 inhibits the middle sections of registers 206-8 and 206-10 from applying their contents to their output terminals. At the same time, signal MDOTSC010 enables the right most section of registers 206-8 and 206-10 to apply their contents to their output terminals. If signal ALPCNT000 is a binary ZERO, this inhibits NAND gate 204-28 from forcing signal MDOTSC010 to a binary ZERO in response to signal READCM000. Accordingly, the right most sections of registers 206-8 and 206-10 are also inhibited from applying their contents to their output terminals.

Lastly, the section 204 further includes an AND gate 204-30. This AND gate in response to the timing signals DLY400010 and DLY220010 generated by the delay line timing circuits provides a reset signal RESET010 which is used to reset the soft error rewrite control circuits of section 214.

Section 207

FIG. 2 illustrates the different sections of address section 207. As shown, section 207 includes an input address section 207-1, an address decode section 207-2, an address register section 207-4 and a refresh and initialize address register input section 207-6.

Sections 207-1 and 207-2

The input address section 207-1 includes a set of manually selectable switches of block 207-10 which receive bus address signals BSAD04110 and BSAD06110. These switches select the high order bus address bit which selects the upper/lower 256K of memory when the system includes the full complement of 128K memory modules. When the memory modules are constructed using 64K chips, the top switch is placed in the closed position. This selects address 4 (signal BSAD04110) as the high order bus address bit. For 16K chips, the other switch is placed in the closed position which selects address bit 6.

Since it is assumed that the memory modules use 64K chips, the top switch is closed while the other switch is opened. The resulting high order bit signal BSADX6010 in addition to its complement along with the least significant bus address bits 22 and 21 are stored in a register 207-12. The three signals are loaded into a register 207-12 when address strobe signal ADDSTR000 is forced to a binary ZERO. This occurs when the memory becomes busy (i.e., accepts a bus cycle/a memory request).

The outputs of register 207-12 are applied as inputs to a 2 to 1 MUX SN74S157), conventional in design. As shown, signal APLCNT000 from section 214 is inverted via inverter circuit 207-16 and applied as signal ALPCNT010 to the select input terminal (G0/G1) of circuit 207-14. When signal ALPCNT010 is a binary ZERO, signals BSAD22210 through BSADX6210 of register 207-12 are selected to be applied at the Y output terminals of circuit 207-14. When signal ALPCNT010 is a binary ONE, signals ARAD21010 and ARADX6010 from section 207-6 are selected to be applied to the Y2 and Y3 output terminals while Y1 output terminal is forced to a binary ZERO.

As shown, the least significant address bit signals LSAD22210 and LSAD21210 are applied to the input terminals of a binary decoder circuit 207-20. The least significant bit address signal LSAD22210 and its complement signal LSAD22200 generated by an inverter circuit 207-22 are applied to sections 204 and 206. The high order bit signal LSADX6210 is applied to the enable/gate input terminal of decoder circuit 207-20. The complement signal LSADX6200 generated by an inverter circuit 207-15 is applied to the enable/gate input of decoder circuit 207-31, together with address signals LSAD22210 and LSAD21210. When high order address signal LSADX6210 is a binary ZERO, decoder circuit 207-20 is enabled for operation. Similarly, when signal LSADX6210 is a binary ONE, decoder circuit 207-31 is enabled for operation.

Each of the four decode outputs DECOD0000 through DECOD3000 connects to a different pair of the NAND gates 207-24 through 207-30. It will be noted that the zero decode signal DECOD0000 connects to the inputs of NAND gates 207-24 and 207-26 which generate the 0 and 1 row address strobe signals. Similarly, the 1 decode signal DECOD1000 connects to the inputs of NAND gates 207-26 and 207-28 which generate the 1 and 2 row address strobe signals. The next sequential decode signal DECOD2000 connects to the two NAND gates which generate the next pair of sequential row address strobe signals. Lastly, the last decode signal DECOD3000 connects to NAND gates 207-30 and 207-24 which generate the 3 and 0 row address strobe signals. In a similar fashion, each of the four decode oututs DECOD4000 through DECOD7000 connects to a different pair of the NAND gates 207-32 through 207-38.

As seen from FIG. 2, all of the NAND gates 207-24 through 207-30 and 207-32 through 207-38 receive a further input signal OVRDEC000 generated by an AND gate 207-39. When either initialize signal INITMM100 or refresh command signal REFCOM100 is forced to a binary ZERO by the circuits of section 212 or section 204, AND gate 207-39 forces signal OVRDEC000 to a binary ZERO. This turns on all the decode signals (i.e., signals DRAST0010 through DRAST7010 are forced to binary ONES) enabling eight memory locations to be written simultaneously during an initialize mode of operation, or "refreshed" during a refresh mode. As shown, the even row address strobe signals DRAST0010 and DRAST2010 are applied to the RAM chips of the even stack units 210-20. The odd row address strobe signals DRAST1010 and DRAST3010 are applied to the RAM chips of the odd stack units 210-40.

Section 207-4

The address register section 207-4 as shown in FIG. 2 receives the bus address signals BSAD05210 through BSAD20210 applied via the bus receiver circuits of block 213 of FIG. 1 as inputs to different stages of a row address register 207-40 and a column address register 207-41. Also, as seen from FIG. 2, this section receives inputs from the circuits of block 207-6 which are applied to different stages of a refresh address register 207-42 and a column address register 207-43. The enabling gate input terminals of registers 207-40 and 207-41 are connected to receive a memory busy signal MEMBUZ010 from section 204. The enabling gate input terminals of registers 207-42 and 207-43 are connected to a +5 volts source. The OC input terminal of row address register 207-40 is connected to receive a timing signal MRASCT000 generated by AND gate 207-44, inverter circuit 207-46 and NAND gate 207-47 in response to signals INITMM000, REFCOM000 and MCASTT010. The OC input terminal of column address register 207-41 is connected to receive a timing signal MCASCT000 generated by NAND gate 207-48 and NAND gate 207-50 in response to signals INTREF000 and MCASTT010. The signal INTREF000 is generated by series connected AND gates 207-44 and 207-48 which receive signals INITMM000, REFCOM000 and ALPCNT000. The OC input terminal of refresh address register 207-42 is connected to receive a control signal MREFCT000 generated by NAND gate 207-49, NAND gate 207-51 and inverter circuit 207-45, in response to signals INTREF000, MCASTT010, MCASTT010 and INITAL110.

Each of the address registers 207-40 through 207-43 are constructed from D type transparent latch circuits such as those designated as SN74S373 previously discussed. As seen from FIG. 2, the different address output terminals of the registers of each set are connected in common in a wired OR arrangement for enabling the multiplexing of these address signals. As previously described, such multiplexing is accomplished by controlling the state of the signals applied to the output control (OC) input terminals of the registers 207-40 through 207-43.

More specifically, the output control (OC) terminals enable so-called tristate operation which are controlled by the circuits 207-44 through 207-51. When each of the signals MRASCT000, MCASCT000, MREFCT000 and MWRTCT000 is in a binary ONE state, this inhibits any address signals from being applied at the Q output terminals of that register. As mentioned, this operation is independent of the latching action of the register flip-flops.

Additionally, section 207-4 includes a 4-bit binary full adder circuit 207-54, converntional in design. The adder circuit 207-54 is connected to increment by one, the low order address bits 20 through 17. In greater detail, the input terminal A1-A8 receive signals MADD00010 through MADD03010. Binary ZERO signals are applied to input terminals B1-B8. An AND gate 207-56 generates a carry in signal MADDUC010 as a function of the states of the least significant address signals LSAD22210 and LSAD21210, signal INTREF000 and timing signal DLY060010.

Figure 7:
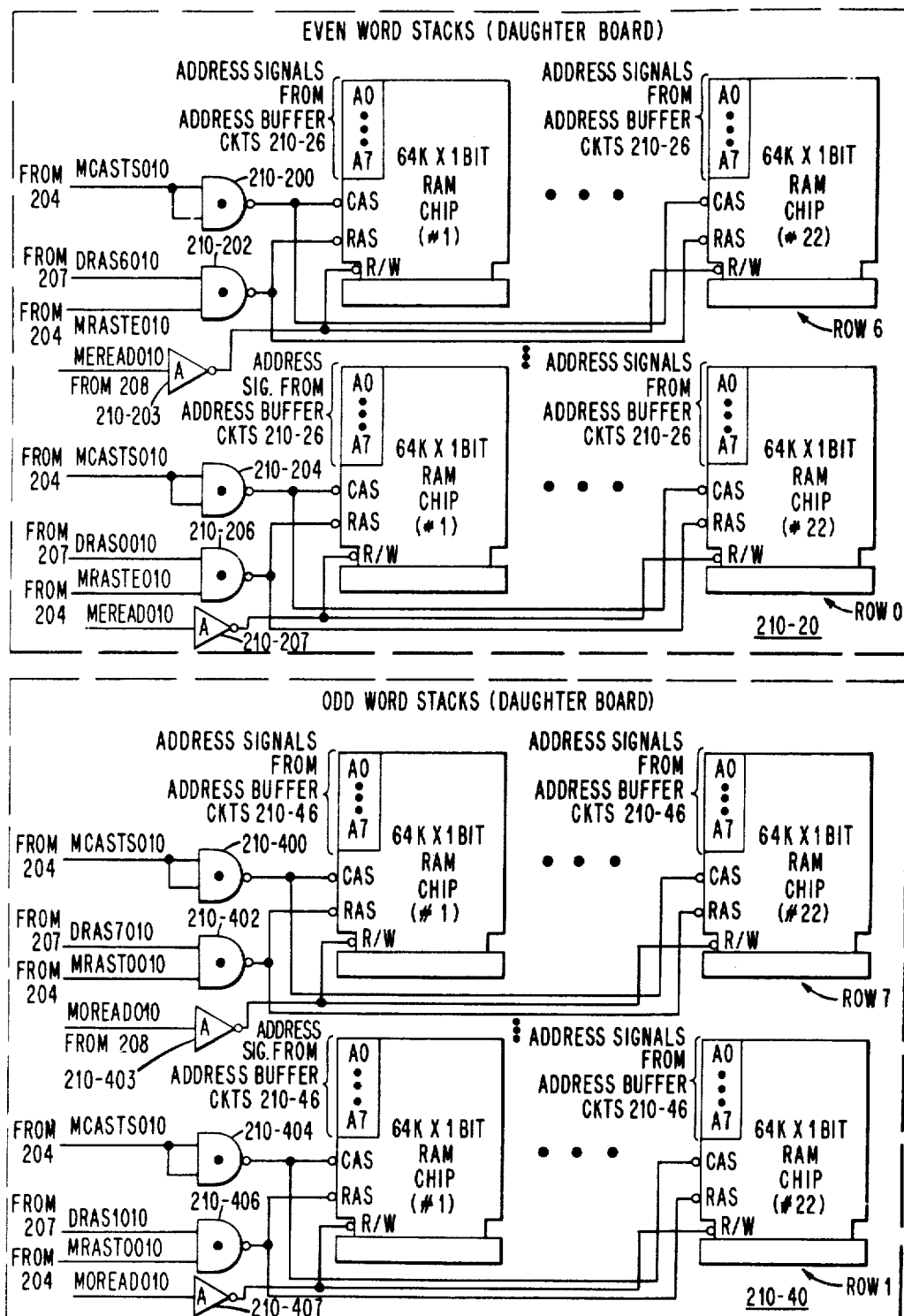
FIG. 7 discloses in greater detail the chips of blocks 210-20 and 210-40.

The incremented output signals MADD00111 through MADD03111 appearing at adder sum terminals S1-S8 are applied via address buffer circuits 210-26 to the even stack RAM chips of FIG. 7. The same is true of signals MADD0410 through MADD07010. The odd stack RAM chips of FIG. 7 are connected to receive the address signals MADD0010 through MADD07010 via address buffer circuits 210-46.

Section 207-6

The refresh and initialize address register input section 207-6 includes the refresh counter and write address counter circuits which generate the address values applied to the refresh and write address registers of section 207-4. As shown, the refresh counter circuits include two series connected binary counters 207-60 and 207-61, each constructed from 74LS393 type circuit chips. Counter 207-60 is connected to receive a clocking signal RADDUC000 which is generated by an inverter circuit 207-67, NOR gate 207-66 and AND gates 207-65 and 207-68 in response to signals ALPHUC010, INITMM100, REFCOM000 and MCASTT010. Both counters receive a clearing signal MYCLRR010 from section 212.

The write counter circuits also include two series connected binary counters 207-62 and 207-63 which are driven by signal REFAD8010 from the refresh counter circuits. Both counters receive a clearing signal MYCLRR110 generated by a NAND gate 207-69 in response to signals MYCLRR000 and PWONLL010.

The circuits further include a D-type flip-flop 207-71 which serves as an extra stage of counter 207-63. The flip-flop 207-71 is connected to receive the complement signal WRITA7100 of most significant write address bit signal WRITA7010 from an inverter circuit 207-72. Initially, when signal WRITA7010 is a binary ZERO, signal WRITA7100 is a binary ONE. Upon power-up, the D-type flip-flop 207-71 is cleared by signal MYCLRR100. When signal WRITA7010 switches to a binary ONE at the end of a first pass, signal WRITA7100 switches from a binary ONE to a binary ZERO which has no effect on the state of flip-flop 207-71. Upon completion of a second pass, signal WRITA7010 switches back to a binary ZERO which causes signal WRITA7100 to switch flip-flop 207-71 from a binary ZERO to a binary ONE. At this time, signal MADROL000 switches from a binary ONE to a binary ZERO. The signal MADROL000 is applied to section 212 and is used to signal the completion of the initialization operation. The flip-flop 207-71 is enabled for operation by signal PWONLL010 and a +5 volt signal which are applied to the preset and D input terminals, respectively. Also, an NAND gate 207-70 applies a signal MYCLRR100 to the clear input terminal which is generated in response to signal PWONLL300 and PWONLL010 from section 212.

As seen from FIG. 2, section 207-6 includes a further binary counter 207-64. This counter also receives signal WRITA7010 from write address counter 207-63. It receives clearing signal MYCLRR110 from NAND gate 207-69. As explained herein, this counter supplements the existing refresh and initialization circuits and forms a part of the soft error rewrite control circuits of the present invention as explained herein.

Read/Write Control Section 208

Figure 5:
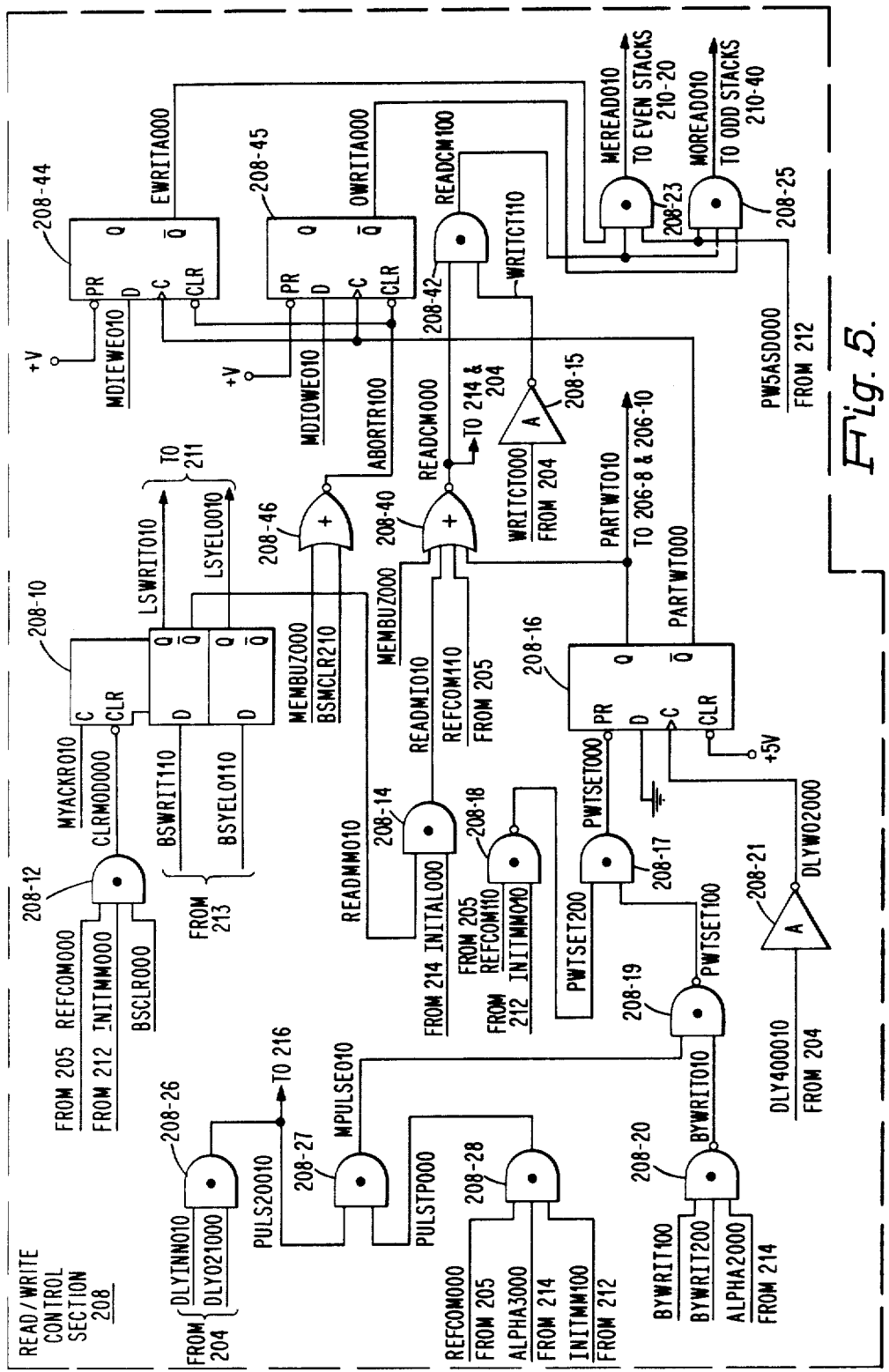
FIG. 5 discloses in greater detail the read/write control circuits of block 208.

A portion of the circuits of section 208 is shown in greater detail in FIG. 5. As mentioned, the section 208 includes a register 208-10 and circuits 208-12 through 208-45. The register 208-10 is a two-stage D-type flip-flop register for storing signal BSWRIT110 which is representative of a read/write command and signal BSYELO110 which is representative of a bus single bit error condition. These signals are latched when signal MYACKR010 from section 211 switches to a binary ONE. When any one of the signals REFCOM000, INITMM00 or BSMCLR000 switches to a binary ZERO, an AND gate 208-12 forces signal CLRMOD000 to a binary ONE which clears register 208-10 to a binary ZERO state.

The write mode signal LSWRIT010 and error condition signal LSYEL0010 are applied to section 211. The read mode signal READMM010 is applied to an AND gate 208-14 which also receives an initialize signal INITAL000 from section 214.

The AND gate 208-14 in response to a read command (i.e., signal READMM010 is a binary ONE) when the system is not being initialized or is carrying out a soft error rewrite cycle operation (i.e., signal INITAL000 is a binary ONE) forces signal READMI010 to a binary ONE. When signal READMI010 is a binary ONE, this causes a NOR gate 208-40 to force a read command signal READCM000 to a binary ZERO. An AND gate 208-42 in response to signal READCM000 forces signal READCM100 to a binary ZERO. A pair of AND gates 208-23 and 208-25 force signals MEREAD010 and MOREAD010 to binary ZEROS. These signals are applied to the read/write control lines of the even and odd stack units 210-20 and 210-40. However, the signals are inverted by circuits included with units 210-20 and 210-40 as shown in FIG. 7 before being applied to the chips which comprise such units.

Another one of the input signals to NOR gate 208-40 is partial write signal PARTWT010. As discussed in U.S. Pat. No. 4,185,323, there are certain types of memory operations such as byte write and initialize operations which require two cycles of operation. The same is true for rewrite cycles of operation. As mentioned, the case of an initialize or a rewrite operation, signal INITAL000 is forced to a binary ZERO. This is effective to override the command applied to the bus. The read/write command signals MEREAD010 and MOREAD010 applied to the stack units 210-20 and 210-40 are generated as a function of signal PARTWT010. Signal PARTWT010 when forced to a binary ONE remains a binary ONE until the end of the first cycle and initiates a second cycle operation during which another set of timing signals identical to the first are generated by the circuits of section 204. During the first cycle, the read/write command signals are forced to binary ZEROS and during the second cycle, the signals are forced to binary ONES. The signal PARTWT010 is generated by a D-type flip-flop 208-16 with associated input circuits 208-17 through 208-26. The flip-flop 208-16 is enabled for switching when signal PWTSET000 applied to preset input terminal is forced to a binary ZERO by AND gates 208-17, 208-26, 208-27 and 208-28, in addition to NAND gates 208-18, 208-19 and 208-20 in response to refresh command signal REFCOM110, initialize signal INITMM010, timing signal MPULSE010, byte write signals BYWRIT100 and BYWRIT200 and rewrite phase 2 signal ALPHA2000. This enables flip-flop 208-16 to switch to a binary ONE. The flip-flop 208-16 switches to a binary ZERO state in response to signal DLYW02000 being applied to the clock input terminal via an inverter circuit 208-21. The +5 volts signal applied to the clear input terminal of flip-flop 206-18 inhibits resetting. In the same manner, as described above, partial write signal PARTWT010 when forced to a binary ONE initiates a read cycle of operation prior to initiating the write cycle of operation required for the execution of the above mentioned operations in addition to each soft error rewrite control operation of the present invention as explained herein. As seen from FIG. 1, partial write signal PARTWT010 is applied to the G input terminals of the right most sections of registers 206-8 and 206-10. Signal PARTWT010 when a binary ONE enables the storage of the output signals from EDAC circuits 206-12 and 206-14.

The other signals MEMBUZ000 and REFCOM110 applied to NOR gate 208-40 are forced to binary ONES prior to the start of a memory cycle of operation and during a refresh cycle respectively. It will be noted from FIG. 5 that during a write cycle of operation when signal WRITCT000 is forced to a binary ZERO by the circuits of section 204, signal WRITCT110 generated by an inverter circuit 208-15 causes AND gate 208-42 to switch signal READCM100 to a binary ONE. This in turn causes AND gates 208-23 and 208-24 to force signals MEREAD010 and MOREAD010 to binary ONES indicating that the stack units 210-20 and 210-40 are to perform a write cycle of operation. At this time, a power on signal PW5ASD000 from section 212 is normally a binary ONE while abort write signals EWRITA000 and OWRITA000 in the absence of error conditions are binary ONES.

As seen from FIG. 5, the signals EWRITA000 and OWRITA000 are received from flip-flops 208-44 and 208-45. These flip-flops receive as inputs signals MDIEWE010 and MDIOWE010 from EDAC circuits 206-12 and 206-14. The states of these signals are stored in the flip-flops 208-44 and 208-45 when signal PARTWT010 switches from a binary ONE to a binary ZERO. The flip-flops 208-44 and 208-45 are cleared to ZEROS via a NOR gate 208-46 when the memory is not busy (i.e., signal MEMBUZ000 is a binary ONE) or is cleared (i.e., signal BSMCLR210 is a binary ONE).

Memory Units 210-20 and 210-40—FIG. 7

As previously discussed, the even word and odd word stacks of blocks 210-20 and 210-40 are shown in greater detail in FIG. 7. These stacks include four rows of 22 64K×1-bit RAM chips as shown. Each 64K chip includes two 32,768 bit storage arrays. Each array is organized into a 128 row by 256 column matrix and connects to a set of 256 sense amplifiers. It will be appreciated that other 64K chip organizations may also be utilized. The chips and associated gating circuits are mounted on a daughter board. Each daughter board includes 2 inverters (e.g. 210-203, 210-207) which are connected to receive a corresponding one of the read/write command signals from section 208 and four, 2 input NAND gates (e.g. 210-200 through 210-206 and 210-400 through 210-406) which are connected to receive the row and column timing signals from section 204 and the row decode signals from section 207. Only those chip terminals pertinent to an understanding of the present invention are shown. The remaining terminals, not shown, are connected in a conventional manner. For further information, reference may be made to the copending patent application "Rotating Chip Selection Technique and Apparatus", invented by Chester M. Nibby, Jr. and William Panepinto, Jr., Ser. No. 921,292, filed on July 3, 1978 and assigned to the same assignee as named herein.

INITIALIZE SECTION 212

Figure 6:
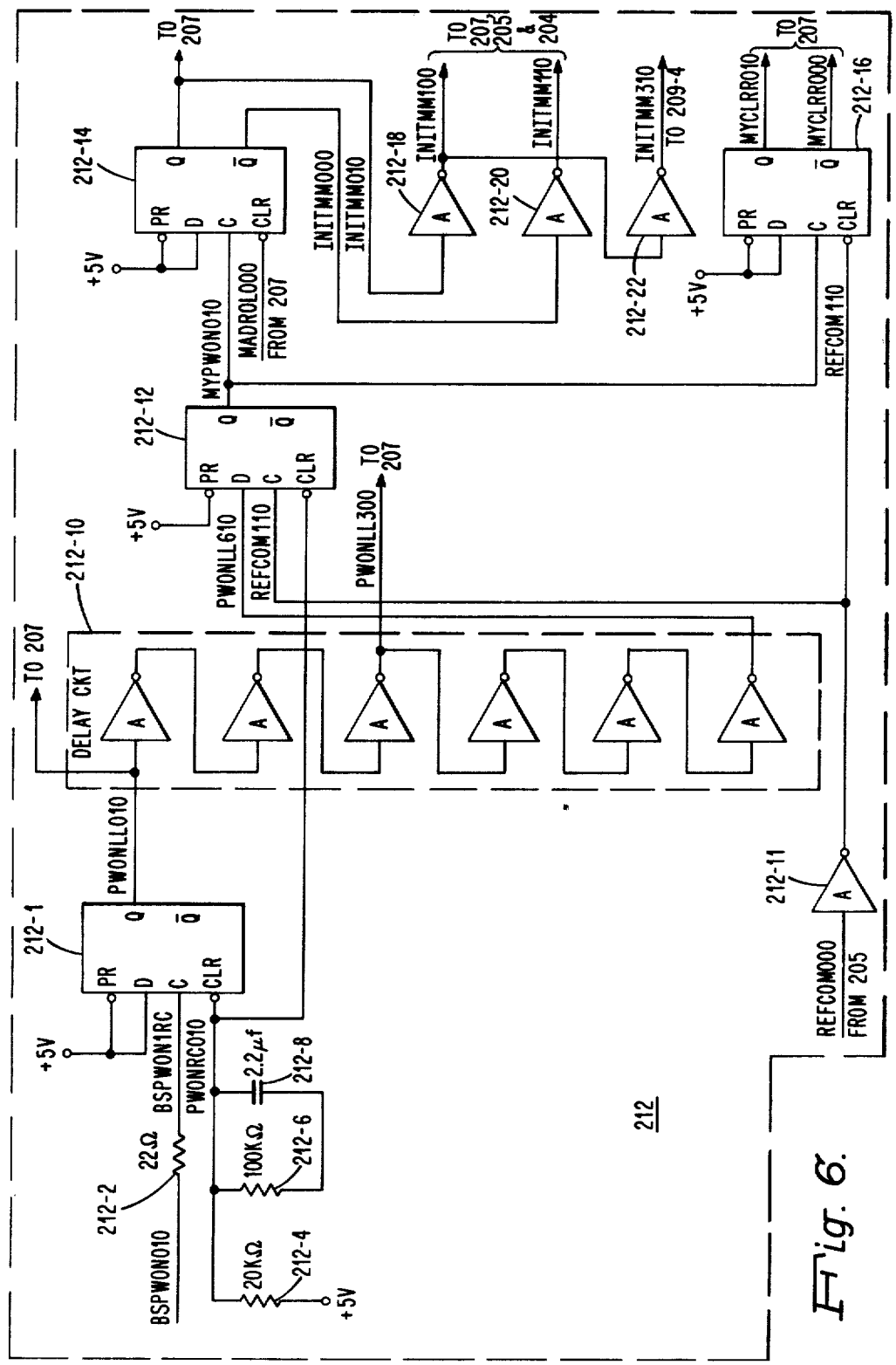
FIG. 6 discloses in greater detail the circuits of block 212.

FIG. 6 shows in greater detail, the initialize logic circuits of section 212. As shown, the circuits include a power on flip-flop 212-1, a power on register flip-flop 212-12, an initialize mode flip-flop 212-14 and a clear flip-flop 212-16. All of the flip-flops are D-type flip-flops. The power on flip-flop 212-1 receives a bus power on signal BSPWON010 at its clock input terminal via a series connected resistor 212-2. A +5 volt signal PWONRC010 is applied to clear input terminals of the flip-flops 212-1 and 212-12 via a series connected resistor 212-4 when power is applied. A resistor-capacitor filter network including resistor 212-6 and capacitor 212-8 connect in parallel to the clear input terminal.

The binary ONE output signal PWONLL010 is applied to the input of a delay circuit 212-10 constructed of 6 series connected inverter circuits. The output signal POWNLL610 generated by delay circuit 212-10 is applied to the D input terminal of flip-flop 212-12. When signal PWONLL610 is forced to a binary ONE following the switching of signal PWONLL010 to a binary ONE, flip-flop 212-12 switches to a binary ONE state on the positive going edge of signal REFCOM210. The clear flip-flop 212-16 switches signal MYCLRR010 to a binary ONE in response to signals MYPWON010 and REFCOM210. The binary ONE output signal MYPWON010 of flip-flop 212-12 is applied to the clock input terminals of initialize mode flip-flop 212-14 and clear flip-flop 212-16. The change in state in signal MYPWON010 switches flip-flops 212-14 and 212-16 to binary ONE states. REFCOM210 resets flip-flop 212-16 to a binary ZERO.

The binary ONE and binary ZERO outputs from these flip-flops are applied to the circuits of sections 205, 207 and 209 via inverter circuits 212-18, 212-20 and 212-22 together with signal PWONLL300 generated by delay circuit 212-10. The initialize mode flip-flop 212-16 switches to a binary ZERO when the circuits of section 207 force signal MADROL000 to a binary ZERO.

SOFT ERROR REWRITE CONTROL SECTION 214

Figure 4:
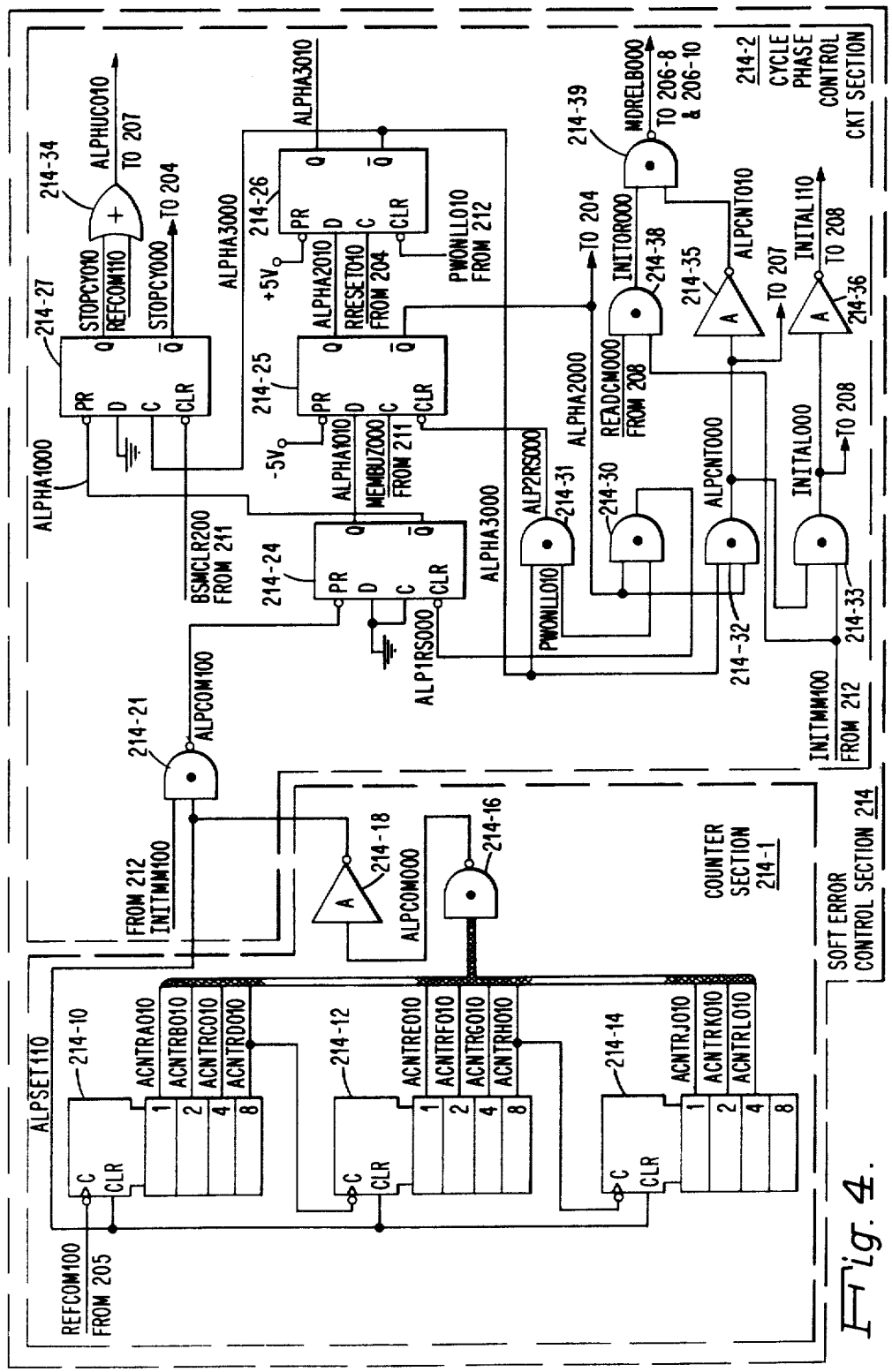
FIG. 4 discloses in greater detail the circuits of block 214 of the present invention.

FIG. 4 shows in greater detail, the soft error rewrite control circuits of the preferred embodiment of the present invention. The section 214 includes a counter section 214-1 and a cycle phase control circuit section 214-2. The section 214-1 establishes the cycle timing for performing a soft error rewrite cycle operation enabling every location in memory to be addressed. Section 214-2 generates the required control signals which define the different phases of operation.

In greater detail, section 214-1 includes three series connected binary counters 214-10 through 214-14, a NAND gate 214-16 and an inverter circuit 214-18. The counters 214-10 through 214-14 constructed from type 74LS393 chips are incremented by one at the end of each refresh cycle in response to signal REFCOM100. This synchronizes the counter operations with the refresh counter circuits. The 11 outputs from the counter stages are applied to NAND gate 214-16. This gate monitors the counts generated by the counters and forces a command signal ALPCOM000 to a binary ZERO each time the counters reach a predetermined count. This predetermined count is selected to have a value which clears out soft errors from memory at a rate which provides a minimum of interference with normal memory operations. The rate is such that after every 2,047 refresh cycles or counts, a rewrite cycle is performed. Therefore, the 512 thousand memory locations can be cleared from the effects of alpha particle contamination or other noise signal disturbances within a two-hour period.

As seen from FIG. 4, the inverter circuit 214-18 inverts the command signal ALPCOM000 to generate a set signal ALPSET110. This signal is applied to the clear input terminals of binary counters 214-10 through 214-14 and to an input NAND gate 214-21 of section 214-2. When signal ALPSET110 is forced to a binary ONE, it clears counters 214-10 through 214-14 to ZEROS for starting a new count.

As seen from FIG. 4, section 214-2 includes three phase control D-type flip-flops 214-24 through 214-26 which connect in series, a stop cycle D-type flip-flop 214-27 and associated input and output gate and inverter circuits 214-30 through 214-36 connected as shown. Each of the flip-flops 214-24 through 214-26 are cleared to binary ZEROS in response to a power on signal PWONLL010 generated by the circuits of section 212 (i.e., when signal PWONLL010 is a binary ZERO). The stop cycle flip-flop 214-27 is reset to a binary ZERO state when a bus clear signal BSMCLR200 is forced to a binary ZERO.

When an initialize operation is not being performed (i.e., signal INITMM100 is a binary ONE), NAND gate 214-21 in response to signal ALPSET110 being forced to a binary ONE, switches the phase 1 flip-flop 214-24 to a binary ONE. The flip-flop 214-24 when in a binary ONE state defines the refresh portion of the rewrite cycle. The binary ZERO output signal ALPHA1000 is applied to the preset terminal of stop cycle flip-flop 214-27. This switches flip-flop 214-27 to a binary ONE state.

The memory busy signal MEMBUZ000 is switched to a binary ZERO in response to a refresh command (i.e., when signal REFCOM110 switches to a binary ONE). At the end of the refresh cycle when the memory busy signal switches from a binary ZERO to a binary ONE, signal ALPHA1010 causes the phase 2 flip-flop 214-25 to switch to a binary ONE. This forces signals ALPHA2000 to switch to a binary ZERO which in turn resets the phase 1 flip-flop 214-24 to a binary ZERO state via AND gate 214-30. The flip-flop 214-25 when in a binary ONE state defines the read portion of the rewrite cycle sequence.

The binary ONE output signal ALPHA2010 is applied to the D input terminal of the phase 3 flip-flip 214-26. When the RRESET010 pulse signal is generated by the circuits of section 204 at the end of the read cycle of operation, the trailing edge of the pulse signal switches flip-flop 214-26 to a binary ONE state. The binary ZERO output signal ALPHA3000 upon being switched to a binary ZERO resets phase 2 flip-flop 214-25 to a binary ZERO via AND gate 214-31. The binary ONE state of the phase 3 flip-flop 214-26 defines the write portion of the rewrite cycle. At the end of the write cycle of operation, RRSET010 pulse signal switches the phase 3 flip-flop 214-26 to a binary ZERO state since the signal ALPHA2010 is a binary ZERO at this time.

When either the phase 2 flip-flop 214-25 or phase 3 flip-flop 214-26 is a binary ONE, the signal ALPHA2000 or signal ALPHA3000 applied to AND gate 214-32 forces signal ALPCNT000 to a binary ZERO. The signal ALPCNT000 when forced to a binary ZERO conditions the circuits of section 207 to select the address signals from the rewrite counter circuit for decoding during these portions of the rewrite cycle sequence. Additionally, signal ALPCNT000 causes AND gate 214-33 to force signal INITAL000 to a binary ZERO which conditions the circuits of section 208 so as to override bus commands during the read and write portions of a rewrite cycle.

Additionally, signals INITMM100 and READCM000 when binary ONES cause an AND gate 210-38 to force signal INITOR000 to a binary ONE. This signal together with the complement signal ALPCNT010 generated by an inverter circuit 214-35 when forced to binary ONES, condition a NAND gate 214-39 to force signal MDRELB000 to a binary ZERO. As seen from FIG. 1, signal MDRELB000 is applied to the OC terminals of the right sections of registers 206-8 and 206-10. When a binary ZERO, signal MDRELB000 enables the contents of these registers to be applied to their output terminals.

It will also be noted that when the phase 3 flip-flop 214-26 is reset to a binary ZERO, the switching of signal ALPHA3000 from a binary ZERO to a binary ONE resets the stop cycle flip-flop 214-27 to a binary ZERO. This causes a change in state of up count signal ALPHUC010 generated by OR gate 214-34 which in turn increments by one the counter circuits of section 207. OR gate 214-34 also generates an increment signal at the end of a refresh cycle in response to signal REFCOM110.

DESCRIPTION OF OPERATION

With reference to FIGS. 1-7, the operation of the preferred embodiment of the present invention will now be described with particular reference to the timing diagrams of FIGS. 8a through 8c. To appreciate the operation of the present invention, it is helpful to describe how the refresh and initialize circuits carry out refresh and initialize operations.

Figure 9:
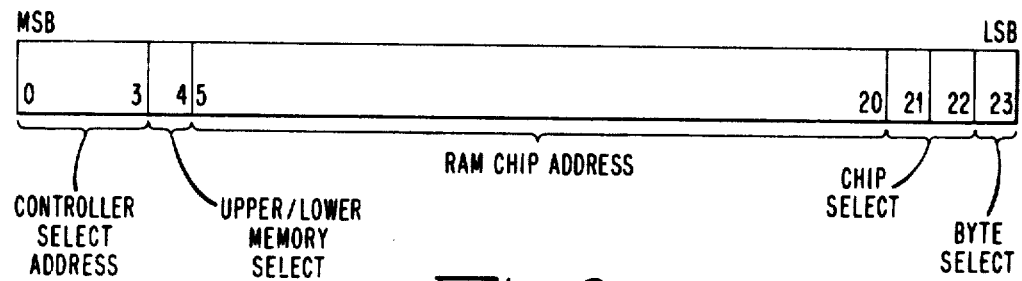
FIG. 9 illustrates the format of the memory addresses applied to controller 200 as part of each memory read or write request.

Before discussing an example of operation, reference is first made to FIG. 9. FIG. 9 illustrates the format of the memory addresses applied to the memory subsystem as part of each memory read or write request. The high order/most significant bit positions are coded to identify the memory module/controller to process the request. Address bit 4 is used to select which 256K half (i.e., upper or lower half) of controller memory is being accessed. These address bits are processed by the circuits of controller 200 and are not provided to the RAM chips.

Address bits 5-20 specify the address of the 22-bit storage location within the RAM chips being addressed. As explained in greater detail herein, these 16 address bits are multiplexed into 8 address inputs and applied via the address buffer circuits of blocks 210-26 and 210-46 to the address input terminals A0-A7 of the RAM chips of FIG. 7.

The least significant address bits 21-22 are coded to select which row of RAM chips are being addressed. As discussed herein, these bits are decoded and used to generate a pair of row address strobe (RAS) signals which latch the 8-bit row addresses into the desired row of RAM chips within each memory stack.

Figure 8A:
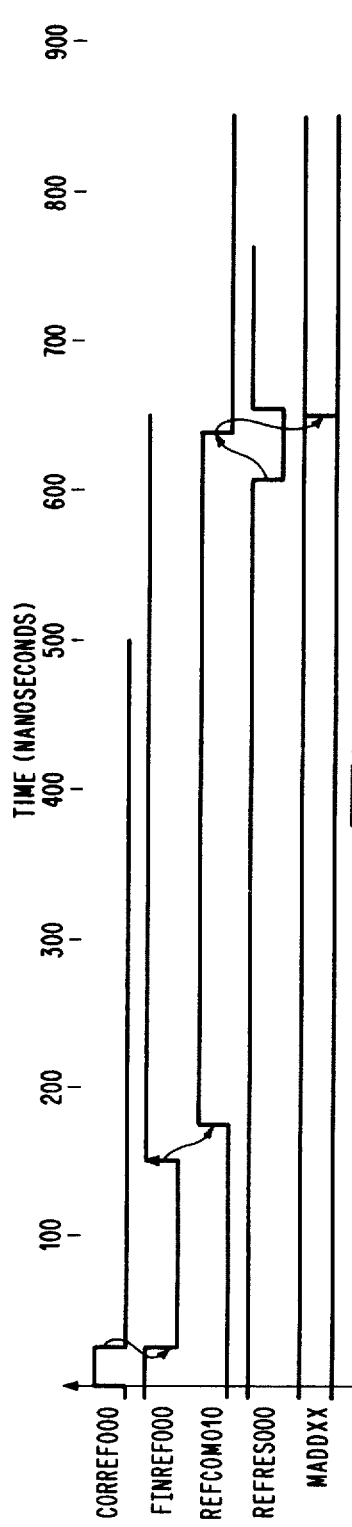
FIGS. 8a through 8c are timing diagrams used to explain the operation of the present invention.

FIG. 8a illustrates diagramatically the different timing signals involved during the execution of a refresh cycle of operation by the refresh circuits of section 205 of FIG. 1. As previously discussed, these circuits take the form of the circuits disclosed in U.S. Pat. No. 4,185,323. The circuits 205 provide a means of substituting a refresh cycle of operation. This occurs when the controller 200 is not in the process of executing a memory cycle, not anticipating any memory cycle or not requesting a cycle. It will be appreciated that refresh cycles are distributed over a four millisecond interval specified for refreshing the total number of rows/columns of the memory system. In the case of a 64K MOS chip, 256 cycles are required to refresh all of the cells of the entire chip. In the present system, a refresh cycle of operation is started every 15 microseconds by the 30 nanosecond width pulse signal CORREF000. This signal, in turn, causes the generation of a 150 nanosecond fine refresh timing pulse signal FINREF000. The signal FINREF000 causes the switching of a refresh command flip-flop to a binary ONE. As seen from FIG. 8a, this results in signal REFCOM010 being forced to a binary ONE. Thus, the complement of the refresh command signal REFCOM000 switches to a binary ZERO.

Referring to FIG. 2, it is seen that signal REFCOM000 causes NAND gate 207-49 to force refresh signal MREFCT000 to a binary ZERO. When the binary ZERO signal is applied to the output control (OC) terminal of refresh address register 207-42, this causes the register 207-42 to apply the refresh address contents to the odd and even stack units 210-20 and 210-40 of FIG. 7. Simultaneously, refresh command signal REFCOM100 conditions the timing circuits 204 of FIG. 3 for generating row address timing signals MRASTE010 and MRAST0010. At this time, signal REFCOM100 effectively overrides the state of least significant address bit LSAD22. Also, from FIG. 2, it is seen that signal REFCOM100 while a binary ZERO causes AND gate 207-39 to force signal OVRDEC000 to a binary ZERO. This overrides all of the decoded row strobe signals so that all of the row address strobe signals DRAST0010 through DRAST7010 are forced to binary ONES. This loads the refresh address contents into each of the rows of RAM chips of FIG. 7.

The result is that a row within each row of RAM chips included within the units 210-20 and 210-40 of FIG. 7 are refreshed as a consequence of a read operation being performed on the addressed 8 rows of RAM chip locations. That is, the signals MEREAD010 and MOREAD010 from section 208 are binary ZEROS which causes the RAM chips of FIG. 7 to perform a read cycle of operation. That is, refresh command signal REFCOM110 caused the circuits of FIG. 5 to maintain signals MEREAD010 and MOREAD010 at binary ZEROS. Prior to that, signal MEMBUZ000 was a binary ONE which forced signals MEREAD010 and MOREAD010 to binary ZEROS.

It will also be noted from FIG. 3 that refresh command signal REFCOM100 inhibits the generation of the CAS timing signal and signals MDOECT000 and MDOOCT000. This prevents information to be written into locations within the stack units 210-20 and 210-40 as well as the read out of information to the output registers 206-8 and 206-10 of FIG. 1.

The end of the refresh cycle of operation is signalled by the leading edge of pulse signal REFRES000 which resets the refresh command flip-flop to a binary ZERO. This, in turn, forces signal REFCOM010 to a binary ZERO. At the trailing edge of signal REFCOM010, the AND gate 207-68 of FIG. 2 forces signal RADDUC000 from a binary ZERO to a binary ONE which, in turn, increments by one, the address contents of refresh counter 207-60. This address change is transferred to refresh address register 207-42 as shown in FIG. 8a by the change in signal MADDXX.

The 8-bit counter 207-62 is added to refresh counter 207-60 which enables controller 200 to operate in an initialize mode. The counter 207-62 furnishes the CAS addresses required for writing ZEROS into the addressed storage locations when the controller 200 is in an initialize mode of operation (i.e., signal INITMM010 is a binary ONE).

Figure 8B:
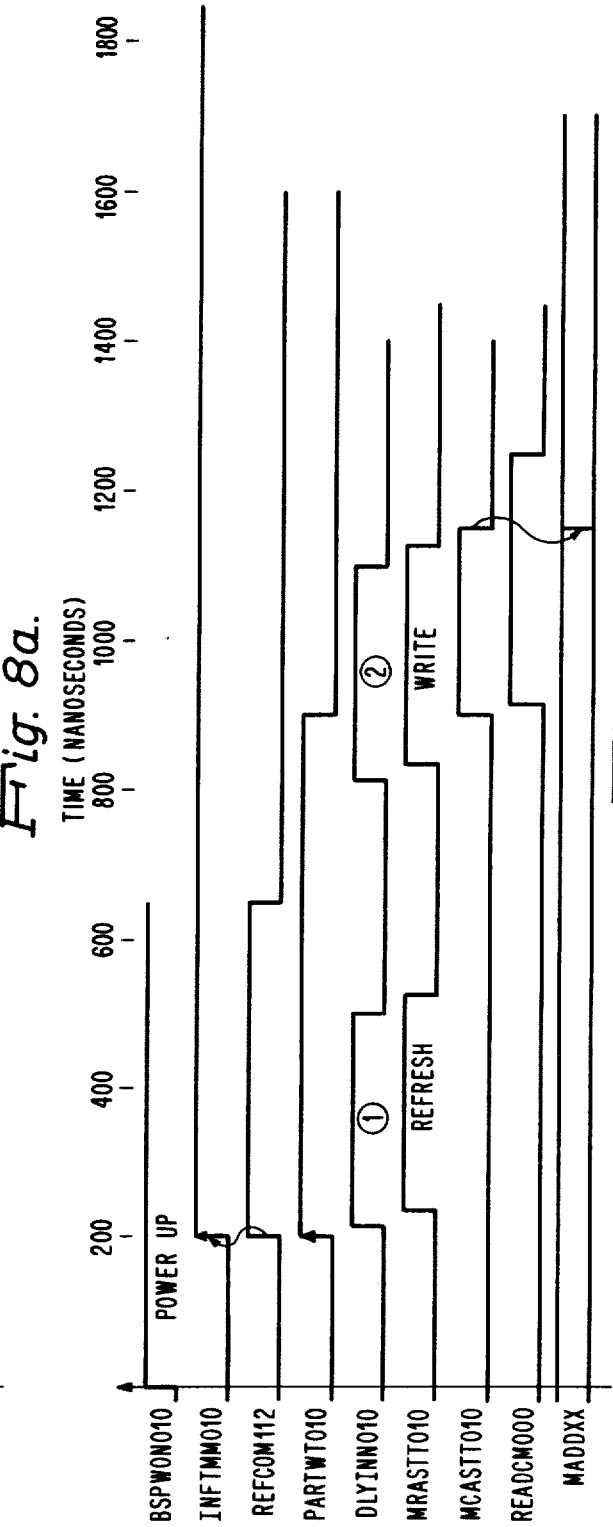

FIG. 8b illustrates the different signals involved during the execution of an initialize cycle of operation by the circuits of section 212 and write address counter circuits of FIG. 2. As shown, when power is turned on, this produces a bus power on transition which results in signal BSPWON010 switching to a binary ONE. From FIG. 6, it is seen that this change of state is latched in flip-flop 212-1. That is, flip-flop 212-1 switches signal PWONLL010 to a binary ONE. The signal PWONLL010 is delayed by circuit 212-10 and then switches flip-flop 212-10 to a binary ONE. As seen from FIG. 8b, the initialize mode flip-flop 212-14 switches to a binary ONE in response to refresh command signal REFCOM110. Prior to that, signal MADROL000 from flip-flop 207-71 of FIG. 2 was switched to a binary ONE by signal PWONLL300. This cleared the initialize mode flip-flop 212-14 to a binary ZERO state.

The refresh command signal REFCOM110 is generated in the manner previously described. It will also be noted that the circuits of section 208 of FIG. 5 switch partial write signal PARTWT010 to a binary ONE. That is, AND gate 208-18 is conditioned by signals REFCOM110 and INITMM010 to force signal PWTSET200 to a binary ONE. This enables flip-flop 208-16 to switch to a binary ONE upon the occurrence of timing signal DLYWO2000.

Signal PARTWT010 when a binary ONE causes AND gate 208-42 to hold signals MEREAD010 and MOREAD010 at binary ZEROS enabling a refresh operation to be performed upon the eight rows of storage locations during the first (1) of two cycles shown in FIG. 8b generated by the timing generator circuits (not shown) of section 204. That is, refresh command signal REFCOM110 when switched to a binary ONE causes the timing generator circuits to initiate a series of timing pulses of a first cycle. This results in signal DLYINN0010 being switched to a binary ONE. Signal PARTWT010 remains a binary ONE and at the end of the first cycle, signal DLYINN010 is switched to a binary ONE. This causes another set of timing signals identical to the first to be generated. Prior to the switching of signal PARTWT010 to a binary ONE, the signals MEREAD010 and MOREAD010 were at binary ZEROS as a consequence of signals MEMBUZ000 and REFCOM010 being forced to binary ONES.

As described above, during the refresh cycle of operation, the refresh command signal causes the refresh address register 207-42 to apply the refresh address contents to the odd and even stack units 210-20 and 210-40, the timing circuits 204 to generate row address timing signals MRASTE010 and MRASTO010 and force all of the decoded row strobe signals to binary ONES. The result, as mentioned above, causes the refreshing of eight rows of storage locations within the RAM chips of FIG. 7.

Since the controller 200 is in an initialize mode, signal INITMM100 inhibits AND gate 207-68 of FIG. 2 from forcing refresh increment signal RADDUC000 to a binary ONE at the end of the refresh cycle. Accordingly, the contents of the refresh address counter 207-60 and 207-61 remain unchanged.

As seen from FIG. 8b, a next cycle is entered during which both RAS and CAS timing signals are generated which enables binary ZERO information to be written into a storage location within each of the eight rows of the RAM chips of FIG. 7. That is, from FIG. 3, it is seen that when initialize signal INITMM100 is forced to a binary ZERO, this enables the generation of timing signals MRASTE010 and MRASTO010. As seen from FIGS. 8b and 3, the timing circuits 204 follow this with the generation of signal MCASTS010 since at this time signal REFCOM100 is a binary ONE. In the manner previously described, the refresh address contents of refresh address register 42 are applied to the odd and even stack units 210-20 and 210-40 as a consequence of signal INITMM000 forcing signal MREFCT000 to a binary ZERO state. The row address signals are stored in each of the rows of RAM chips of FIG. 7 in response to signals MRASTE010 and MRAST0010.

From FIG. 2, it is seen that the power on signal PWONLL010 was forced to a binary ONE, this caused the clearing of the write counter 207-62 and 207-63 to binary ZEROS. The contents of the write counter are, in turn, loaded into the write address register 207-43. The NAND gate 207-51 of FIG. 2, in response to signals MCASTT010 and INITAL110, forces signal MWRTCT000 to a binary ZERO. This causes the write address register 207-43 to apply its column address contents to the stack units 210-20 and 210-40. Since signal INTREF000 was forced to a binary ZERO by signal INITMM000, the adder 207-54 applies the column address contents without modification to even stack unit 210-20.

It is seen from FIG. 8b that when partial write signal PARTWT010 switches to a binary ZERO, this, in turn, switches the read command signal READCM000 to a binary ONE. As seen from FIG. 5, the flip-flop 208-16 switches to a binary ZERO in response to timing signal DLY400010 following the switching of read command signal REFCOMM110 to a binary ZERO. The signal READCM000 conditions AND gate 208-42 to force signal READCM100 to a binary ZERO in response to write timing signal WRITCT000 from the timing generator circuits 204. This, in turn, causes AND gates 208-23 and 208-25 to force signals MEREAD010 and MOREAD010 to binary ZEROS. Accordingly, the RAM chips of FIG. 7 are conditioned to perform a write cycle of operation upon the eight simultaneously selected chip locations during which binary ZEROS, loaded into the even and odd data registers 206-8 and 206-10, are written therein. That is, the initialize signal INITMM310 from section 212, when forced to a binary ONE upon the setting of the initialize mode flip-flop 212-14 of FIG. 6, inhibits the enabling of data-in MUXs 209-4. The result is that binary ZEROS loaded into the leftmost sections of registers 206-8 and 206-10 are applied as inputs to stack units 210-20 and 210-40 in response to signal MDOTSC010. At this time, signals MDOTSC000 and MDRELB000 are binary ONES which inhibit the middle and rightmost sections of registers 206-8 and 206-10 from applying signals to their output terminals.

At the end of the write cycle, as shown in FIG. 8b, signal MCASTT010 switches to a binary ZERO. This causes AND gate 207-68 of FIG. 2 to force signal WTCAST010 to a binary ZERO which, in turn, forces signal RADDUC000 from a binary ONE to a binary ZERO. This causes the series connected refresh and write counter circuits 207-60 through 207-63 to be incremented by a count of one. At the beginning of the next 15 microsecond interval signalled by pulse CORREF000, the sequence of operations illustrated in FIG. 8b is repeated using the next address signals specified by the contents of the refresh and write counter circuits of FIG. 2.

By repeating the above operations, every decoded location of the units 210-20 and 210-40 is initialized to ZEROS. Since the decodes are overridden, binary ZEROS are written into an addressed location in each of the eight rows of 64K RAM chips simultaneously which reduces the amount of time required for initializing the memory subsystem.

The completion of the initialize operation is signalled by the switching of flip-flop 207-71 of FIG. 2 to a binary ONE. This forces signal MADROL000 to a binary ZERO which, in turn, clears initialize mode flip-flop 212-14 to a binary ZERO state. As seen from FIG. 2, the flip-flop 207-71 switches to a binary ONE when the write address bit signal WRITAT100 switches from a binary ZERO to a binary ONE state (i.e., positive going transition). This occurs when bit signal WRITA7010 switches from a binary ONE to a binary ZERO indicating that the last address location has been written.

From the above, it is seen how every decoded location is addressed and initialized to ZEROS. In order to be able to address every location, instead of overriding the decode signals derived from the address signals applied thereto, counter 207-64 is connected in series with the refresh and write address counters 207-60 through 207-63 of FIG. 2. This counter generates the address bits LSAD21 and LSADX6 which are used to address the same location within both units 210-20 and 210-40, in accordance with the principles of the present invention as explained herein.

Figure 8C:
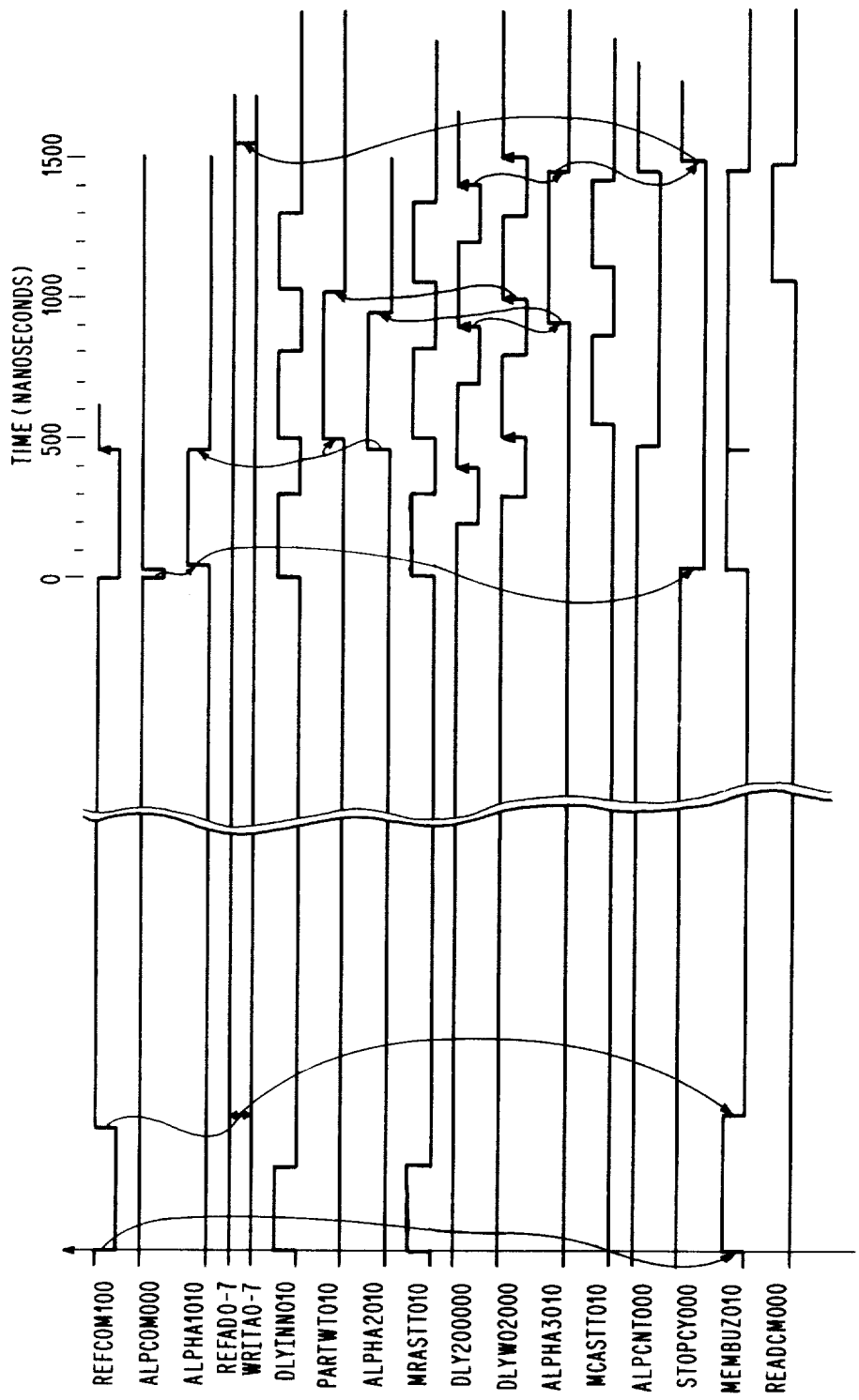

FIG. 8c is used to explain the operation of the present invention in carrying out a soft error rewrite cycle of operation. This operation is provided by extending the refresh and initialize cycles of operation so a to minimize the amount of logic circuits added to the controller 200.

Where, as the initialize mode occurs only during powering up the controller, a soft error rewrite cycle occurs in synchronism with a refresh cycle of operation. The frequency of occurrence of the cycle is established by signal ALPCOM000. When this signal is forced to a binary ZERO by an all ONES input from counters 214-10, 214-12 and 214-14, two things occur. One is that the counters 214-10, 214-12 and 214-14 are reset to start counting from ZERO by signal ALPSET110 being forced to a binary ONE. The other is that the phase 1 flip-flop 214-24 is set to a binary ONE.

As seen from FIG. 8c, the setting of the phase 1 flip-flop 214-24 to a binary ONE causes the stop cycle flip-flop 214-27 to switch to a binary ONE. For the purposes of the present invention, this signal indicates the occurrence of a soft error rewrite cycle and its duration.

The phase 1 flip-flop 214-24 defines the period or interval during which a normal refresh cycle takes place. This cycle is carried out in the manner discussed with reference to FIG. 8a. Upon the completion of the refresh cycle, the memory busy signal MEMBUZ000 is forced to a binary ONE. This switches the phase 2 flip-flop 214-25 to a binary ONE. This causes signal ALPHA2000 to reset phase 1 flip-flop 214-24 to a binary ZERO. Normally, as seen from FIG. 8c, the refresh and write counter circuits are incremented at the end of a refresh cycle. However, since a soft error rewrite cycle is being performed at this time, the setting of the stop cycle flip-flop 214-27 forces up count signal ALPHUC010 to a binary ONE. This, in turn, causes the AND gate 207-65 of FIG. 2 to force signal INITUC000 to a binary ONE causing signal RADDUC000 to be forced to a binary ONE. This prevents the incrementing of the refresh and write counters at this time.

As seen from FIG. 8c, the setting of phase 2 flip-flop 214-24 causes partial write flip-flop 208-16 of FIG. 5 to switch to a binary ONE. That is, signal ALPHA2000, when switched to a binary ZERO, forces signal BYWRIT010 to a binary ONE. NAND gate 208-19 forces signal PWTSET100 to a binary ZERO upon the occurrence of signal MPULSE010. This forces signal PWTSET000 to a binary ZERO which enables flip-flop 208-16 to switch to a binary ONE state. The setting of the partial write flip-flop 208-16 signifies that the timing generator circuits 204 will generate two sequences of timing signals, one for a read cycle followed by a write cycle. When the flip-flop 208-16 switches to a binary ONE, it causes read command signals MEREAD010 and MOREAD010 to be forced to binary ZEROS.

As seen from FIG. 4, signal ALPCNT000 is switched to a binary ZERO when the phase 2 flip-flop 214-25 switched to a binary ONE. This signal causes the multiplexer circuit 207-14 of FIG. 2 to select as a source of address signals, the signals ARAD21010 and ARADX6010 from the counter 207-64. As seen from FIG. 2, least significant address bit LSAD22 is forced to a binary ZERO. This effectively eliminates bit LSAD22 causing a double word operation beginning with the even stack units 210-20 so as to take advantage of the address decode arrangement of FIG. 2. Bits 21 and X6 specify the contents of which word locations in stack units 210-20 and 210-40 are to be read out to data registers 206-8 and 206-10. These bits together with bit 22 are decoded by decoder circuits 207-20 and 207-31 which force the appropriate decode row address strobe signals to binary ONES.

Also, signal ALPCNT010 is switched to a binary ONE when phase 2 flip-flop 214-25 is switched to a binary ONE. This signal conditions the timing circuits 204 of FIG. 3 so as to enable the generation of timing signals for cycling both stack units 210-20 and 210-40 during a read cycle of operation. That is, signal ALPCNT010 forces signal RASINH010 to a binary ZERO. This, in turn, causes NAND gates 204-8 and 204-14 to force signals ERASIH000 and ORASIH000 to binary ONES which enables timing signals MRASTE010 and MRAST0010 to be applied to the even and odd stack units 210-20 and 210-40. Also, the AND gates 204-11 and 204-15 are conditioned to apply subsequently timing signals MDOECT010 and MDOOCT010 to the even and odd registers 206-8 and 206-10.

The read operation is performed upon the pair of locations specified by the refresh and write address counters, in addition to counter 207-64. That is, in the manner previously described, the address contents of the refresh and write address counters 207-60 through 207-63 are fed into the refresh address and write address registers 207-42 and 207-43, respectively.

As seen from FIG. 2, signal ALPCNT000 enables the storage of the row address signals by causing AND gate 207-48 to force signal INTREF200 to a binary ZERO. This, in turn, causes NAND gate 207-49 to force signal MREFCT000 to a binary ZERO which enables the address contents of refresh address register 207-42 to be applied to the odd and even stack units 210-20 and 210-40. The row address signals are stored in the RAM chips of FIG. 7 in the pair of rows specified by the outputs from decoder circuits 207-20 and 201-31. As described previously, the address signals are stored in response to even and odd row address strobe signals MRASTE010 and MRASTO010 generated in response to row address timing signal MRASTT010.

In a similar fashion, the column address signals which correspond to the address contents of the write address register 207-43 are stored in all of the RAM chips. More specifically, signal MCASTT010 from timing generator 204 and signal INITAL110 cause NAND gate 207-51 of FIG. 2 to force signal MWRTCT000 to a binary ZERO. This conditions the write address register 207-43 to apply its address contents to the stack units 210-20 and 210-40. These signals are stored in the RAM chips of FIG. 7 in response to column address signal MCASTS010.

The switching of phase 2 flip-flop 214-25 causes the switching of the partial write flip-flop 208-16 to a binary ONE state. This defines the read operation of the cycle by forcing the signal READCM000 to a binary ZERO. Signal READCM000 is a binary ZERO at this time which, in turn, causes signal MEREAD010 and MOREAD010 to be binary ZEROS. Therefore, the RAM chips of the selected pair of rows are conditioned to perform a read operation wherein their contents are read out into the even and odd data registers 206-8 and 206-10 which have been enabled by signals MDOECT0010 and MDOOCT0010, respectively. At this time, read command signal READCM000 holds signal MDRELB000 at a binary ONE. This inhibits the contents of the right most section of registers 206-8 and 206-10 from being applied at the outputs thereof. Also, read command signal READCM000 causes the circuits 204 to force signal MDOTSC100 to a binary ZERO and signal MDOTSC010 to a binary ONE. This inhibits the contents of the left most sections of registers 206-8 and 206-10 from being applied to the inputs thereof. At the same time, the read out word contents, stored in the middle sections of registers 206-8 and 206-10, are applied to EDAC circuits 206-12 and 206-14.

During the read cycle of operation, the words read out from the pair of locations are checked for errors by the error detection circuits included within the EDAC circuits 210-12 and 210-14. Any single bit errors located within the words are corrected by the error correction circuits included with the EDAC circuits 210-12 and 210-14. Since signal PARTWT010 is a binary ONE, the corrected words are loaded into the rightmost sections of registers and rewritten back into stack units 210-20 and 210-40 during the interval defined by the next occurrence of signal MCASTT010 of FIG. 8c.

Where more than one error is detected to have occurred within a word, this causes one of the EDAC circuits 206-12 and 206-14 to force signal MDIEWE010 or signal MDIOWE010 to a binary ONE state. This, in turn, sets the even abort write flip-flop 208-44 or odd abort write flip-flop 208-45 of FIG. 5 to a binary ONE state when partial write signal switches from a binary ZERO to a binary ONE state. As explained herein, this aborts the write operation thereby preserving the error status of the original information.

When the timing generator 204 generates signal RESET010, the phase 3 flip-flop 214-26 is conditioned by the binary ONE state of signal ALPHA2010 to switch to a binary ONE. As seen from FIG. 8c, the phase 2 flip-flop 214-25 is reset to a binary ZERO by AND gate 214-31 of FIG. 4. The switching of the phase 3 flip-flop 214-26 initiates a second sequence of timing signals required for performing a write cycle of operation. Since signal ALPUC010 is still a binary ONE (i.e., the stop cycle flip-flop 214-27 is still a binary ONE, this inhibited the incrementing of the refresh, write and decode address counters 207-60 through 207-64 by signal RADDUC000. Hence, the write operation is performed upon the same pair of locations within the stack units 210-20 and 210-40. In the manner just described, the same row and column address signals are caused to be stored in the RAM chips of the two rows specified by the address bit signals ARAD21010 and ARADX6010.

Briefly, as seen from FIG. 4, the states of signals ALPCNT000 and ALPCNT010 remain the same as a consequence of the phase 3 flip-flop 214-26 being switched to a binary ONE. Accordingly, the row address contents of the refresh address register 207-42 are applied to the stack units 210-20 and 210-40 and stored in the RAM chips of the same two rows addressed during the prior read cycle of operation in response to signal MRASTT010.

In a similar fashion, the column address contents of write address register 207-43 are applied to the stack units 210-20 and 210-40 and stored in the RAM chips of FIG. 7, in response to signal MCASTT010.

As seen from FIG. 8c, during the write cycle, the timing generator circuits 204 repeat the generation of the same sequence of timing signals which cause the contents of the addressed pair of storage locations to be read out into registers 206-8 and 206-10. At this time, partial write signal PARTWT010 is a binary ZERO. That is, the partial write flip-flop 208-16 is reset to a binary ZERO in response to timing signal DLYW0200 since at that time signal ALPHA2000 is a binary ONE.

Since read command signal READCM000 and signal ALPCNT010 are binary ONES, this causes NAND gate 214-39 of FIG. 4 to force signal MDRELB000 to a binary ZERO. This enables the right most sections of registers 206-8 and 206-10 containing the corrected word pair to apply its contents to the outputs thereof. At the same time, signals READCM000 and ALPCNT000 force signals MDOTSC100 and MDOTSC010 to binary ONES. This inhibits the left most and middle sections of registers 206-8 and 206-10 from applying signals at the outputs thereof during this interval.

Accordingly, the contents of the pair of addressed storage locations previously read out into the right most sections of registers 206-8 and 206-10 are written into the addressed storage locations.

Accordingly, any single bit errors occurring within either one or both of the words read out will have been corrected utilizing the error detection and error correction circuits included within the system. Thus, any soft errors are eliminated from the pair of words accessed which, in turn, prevents such errors from turning into double errors which are not correctable.

However, when a double error condition is detected, the occurrence of the condition is stored and causes the write operation to be aborted. That is, in such instances, either signal EWRITA000 or signal OWRITA000 or both are forced to a binary ZERO. This, in turn, causes AND gate 208-23 or AND gate 208-25 to force a corresponding one of the signals MEREAD010 or MOREAD010 to a binary ZERO. This, in turn, inhibits the writing of the uncorrectable words into the corresponding one of the addressed pair of locations. As mentioned, this preserves the error condition within the uncorrectable word.

As seen from FIG. 8c, the resetting of the phase 3 flip-flop 214-46 to a binary ZERO state causes the stop cycle flip-flop 214-27 to reset to a binary ZERO. This signifies the end of the soft error rewrite cycle of operation. As previously discussed, the phase 3 flip-flop 214-26 is reset to a binary ZERO in response to signal RRESET010 from the timing circuits 204.

When the stop cycle flip-flop 214-27 resets, this causes OR gate 214-34 to switch the up count signal ALPHUC010 from a binary ONE to a binary ZERO. As seen from FIG. 8c, this causes the read address and write address counters 207-60 through 207-63 in addition to the decode address counter 207-64 to be incremented by one. That is, signal ALPHUC010 causes increment signal RADDUC000 to switch from a binary ONE to a binary ZERO. This results in updating the counters at the end of the soft error rewrite cycle.

In accordance with the teachings of the present invention, the counters 214-10, 214-12 and 214-14 continue to operate in synchronism with refresh cycles. Following the occurrence of another 2047 refresh cycles, NAND gate 214-16 again forces rewrite command signal ALPCOM000 to a binary ZERO signalling the start another soft error rewrite cycle. By synchronizing the counters on an odd count, which is one less than the maximum count of 2048 (i.e., $2^{11}-1$), this selects a sequence of address values stored in the refresh, write and decode address counters 207-60 through 207-64 which select every location within stack units 210-20 and 210-40.

The above can be seen by considering an arrangement in which a 4-bit binary counter is used in place of counters 214-10, 214-12 and 214-14. In this arrangement, rewrite command signal is forced to a binary ZERO, every 15 counts ($2^4-1$) rather than 16 which is the maximum count ($2^4$).

By way of example, it is assumed that the word size of the memory is 32 and all counters are set to ZERO. To provide a 32 binary addressing capability, the refresh address counter is a 5-bit binary counter. It would generate the following sequence of address values:
0,1,2, . . . 12,13,14, . . . 28,29,30,31,
0,1,2, . . . 10,11,12,13,14, . . . 25,26,27,28,29, . . . etc.

The count sequence defining the addresses of the locations defined by the 4-bit binary counter at which soft error rewrite cycles are initiated is as follows:
0,15,30,13,28,11,26,9,24,7,22,5,20,3,18,
1,16,31,14,29,12,27,8,23,6,21,4,19,2,17,0.

From the above, it is seen that during a first pass of refresh counter addresses, a soft error rewrite cycle takes place at the location having address value 15. In a second pass (i.e., after the next 15 counts), a soft error rewrite cycle takes place at the location having address value 30. This continues as shown. By letting the counters free run and detecting each occurrence of a count of 15, a soft error rewrite cycle will be performed on every location in a non-sequential fashion.

In accordance with the teachings of the present invention, the present size for the rewrite counters 214-10, 214-12 and 214-14 was selected in order to minimize the interference with normal memory operations and still provide the necessary error protection.

From the above, it has been shown how the arrangement of the invention protects the memory system against alpha particle contamination and other system disturbances. This is accomplished with a minimum amount of additional circuits.

It will be appreciated that many modification may be made to the apparatus of the present invention without departing from its teachings. For example, the number of stages of the rewrite control section counter may be expanded or reduced as required to minimize interference with normal memory operations. If desired, the counter may be connected to receive programmed counts via the bus 10. That is, the counter could be loaded with a predetermined count which is decremented by one in response to each refesh command signal until a count is reached at which time a rewrite cycle is initiated and the counter is reset to the predetermined count.

Other changes may also be made to the rewrite control section such as omitting the performance of a refresh cycle during each rewrite cycle. However, for ease of simplicity, the refresh cycle was included. Also, it will be obvious to those skilled in the art that the apparatus of the present invention may be used with different types of memory organizations and MOS chips as well as different types of refresh circuits and error detection and correction circuits.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A semiconductor memory system comprising:

a dynamic memory including a number of addressable arrays of memory cells arranged in a number of rows and columns and said arrays being organized into a number of storage locations;

error detection and correction means coupled to said memory for detecting and correcting single bit errors in the contents of the cells read out from said memory during a memory cycle of operation;

timing means for providing sequences of timing signals for performing said memory cycle of operation;

refresh and write control means coupled to said timing means and to said memory, said refresh control means periodically generating refresh command signals in response to signals from said timing means, and including row and column address counter means; and, rewrite control means coupled to said refresh and write control means and to said timing means, said rewrite control means including counter means operative after each occurrence of a predetermined number of refresh command signals to condition said timing means to generate a sequence of signals during a rewrite cycle of operation for performing read and write cycles of operations upon the cells within the rows and columns of one of said number of storage locations specified by said row and column address counter means for enabling the detection and correction of said single bit errors within said memory by said error detection and correction means at a predetermined rate thereby rendering said memory system less susceptible to soft errors.

2. The system according to claim 1 wherein said rewrite control means includes decode circuit means coupled to said counter means, said decode circuit means being operative in response to signals from said counting means indicating said occurrence of said predetermined number of refresh command signals to generate a rewrite command signal for resetting said counter means and for initiating said rewrite cycle of operation.

3. The system of claim 2 wherein said decode circuit means is connected to said counting means to cause the generation of said rewrite command signal in accordance with a modulus which is one less than the maximum count value generated by said counter means.

4. The system of claim 3 wherein said counter means includes a number of stages and said modulus equals $2^n - 1$ wherein n corresponds to said number of stages.

5. The system of claim 4 wherein n is selected to have a value for detecting and correcting any single bit errors within all of said cells of all of said number of storage locations in said memory and said predetermined rate is selected to minimize interference with normal memory operations.

6. The system of claim 5 wherein n equals 11, said modulus equals 2047 and said predetermined rate equals 0.03 seconds.

7. The system of claim 3 wherein said modulus is selected for generating said rewrite command signal when said refresh address counter means and said write counter means stores a different row address and column address respectively enabling all possible combinations of said row and column addresses to be generated.

8. The system of claim 7 wherein said all combinations of said row and column addresses are generated in a predetermined order.

9. The system of claim 8 wherein said predetermined order is non-consecutive.

10. The system of claim 2 wherein said rewrite control means further includes cycle phase control means for generating signals defining the different cycles of said rewrite cycle of operation and wherein said memory system further includes read/write command control means coupled to said timing means, said refresh and write control means, and to said memory; said cycle phase control means including a plurality of series connected bistable means for generating said signals in a predetermined sequence for conditioning said timing means and said read/write command control means to perform in sequence read and write cycles of operation upon said cells within said rows and columns of said one of said number of storage locations specified by said refresh and write control means.

11. The system of claim 10 wherein said read and write cycles of operation include a refresh cycle of operation.

12. The system of claim 10 wherein said read/write command control means further includes write abort control means coupled to said error detection and correction means, said abort control means being conditioned by a signal from said error detection and correction means indicative of an uncorrectable error to inhibit the performance of said write cycle of operation preventing the writing of uncorrectable errors into the cells within said rows and columns specified by said refresh and write control means thereby preserving original uncorrectable error conditions within said cells.

13. The system of claim 10 wherein said system further includes addressing means, said number of arrays being organized into at least a pair of memory module units, each including a plurality of word storage locations, said refresh and write control means including a pair of series connected bistable means coupled to said addressing means, said pair of series connected bistable means generating signals for conditioning said addressing means to access all of said memory cells of a pair of storage locations within said pair of memory module units during each said rewrite cycle of operation.

14. The system of claim 10 wherein said system further includes initialize control means coupled to said timing and control means, said refresh counter means, said addressing means and said write address counter means, said initialize control means being operative in response to a signal indicative of power being applied to said memory to condition said timing means in response to each refresh command signal to generate signals for applying to said number of arrays to perform a refresh cycle followed by a write cycle upon said cells having the row and column addresses specified by said refresh and write control means until all of said cells of all of said number of arrays have predetermined data written therein.

15. A dynamic semiconductor memory sytem comprising:

a number of addressable arrays of memory cells whose contents must be refreshed within a predetermined time interval, each array being divided into a number of rows and columns and organized into a number of storage locations;

error detection and correction circuit means coupled to said arrays for detecting and correcting single bit errors in the contents of the cells read out during a memory cycle of operation;

addressing means for applying addresses to said number of arrays during said memory cycle of operation;

timing control means for providing predetermined sequences of timing signals for performing said memory cycle of operation upon selected ones of said number of arrays;

refresh control means for periodically generating a refresh command signal for refreshing the memory cells of a different one of each of the rows within said number of arrays within one of a plurality of refresh time intervals evenly distributed throughout said predetermined time interval, said refresh control means being coupled to said addressing means and to said timing and control means, said refresh control means including refresh address counter means for sequentially counting through all of the row addresses required to refresh said number of addressable arrays;

write address counter means coupled in series with said refresh address counter means and to said addressing means, said write address counter means being operative in response to said refresh command signal to generate column address signals; and, soft error rewrite control means coupled to said refresh command control means, said timing and control means and said addressing means, said soft error rewrite control means including counter means operative in response to said refresh command signal to generate a sequence of counts for conditioning said timing and control means to initiate a rewrite cycle of operation after each occurrence of a predetermined number of refresh command signals by generating signals during said rewrite cycle of operation for performing read and write operations upon said cells within the rows and columns of one of said number of storage locations specified by the contents of said refresh address counter means and said write address counter means respectively applied to said addressing means for detection and correction of said single bit errors in the contents of all of said cells of said arrays by said error detection and correction means at a predetermined rate thereby rendering said memory system less susceptible to soft errors.

16. The system according to claim 15 wherein said rewrite control means includes gating means connected to receive signals from said counter means representative of said sequence of counts, said gating means being operative in response to signals representative of a predetermined count corresponding to said occurrence of a predetermined number of refresh time intervals to generate an output rewrite command signal for resetting said counter means and initiating said rewrite cycle of operation.

17. The system of claim 16 wherein said gating means is connected to said counting means to cause the generation of said output rewrite command signal in accordance with a modulus which is one minus the maximum count generated by said counter means.

18. The system of claim 16 wherein said counter means includes a number of stages and said modulus equals $2^n-1$ wherein n corresponds to said number of stages.

19. The system of claim 17 wherein n is selected to have a value for detecting and correcting any single bit errors within all of said cells of said number of arrays and said predetermined rate is selected to minimize interference with normal memory operations.

20. The system of claim 18 wherein n equals 11, said modulus equals 2047 and said predetermined rate equals 0.03 seconds.

21. The system of claim 16 wherein said counter means modulus is selected to cause said generation of each said rewrite command signal when a different row address and column address are stored in said refresh address counter means and said write address counter means respectively enabling all possible combinations of said row and column addresses to be generated.

22. The system of claim 21 wherein said all combinations of said row and column addresses are generated in a predetermined order.

23. The system of claim 22 wherein said predetermined order is non-consecutive.

24. The system of claim 16 wherein said rewrite control means further includes cycle phase control means for generating signals defining the different cycles of said rewrite cycle of operation and wherein said memory system includes read/write command control means coupled to said timing and control means, said refresh control means, said rewrite control means and to said number of arrays, said cycle phase control means including a plurality of series connected bistable means for generating said signals in a predetermined sequence for conditioning said timing and control means and said read/write command control means to perform in sequence read and write cycles of operation upon said different one of said cells within said rows and columns specified by said contents of said refresh address counter means and said write address counter means respectively.

25. The system of claim 24 wherein said read and write cycles of operation include a refresh cycle of operation.

26. The system of claim 24 wherein said read/write command control means further includes write abort control means coupled to said error detection and correction means, said abort control means being conditioned by a signal from said error detection and correction means indicative of an uncorrectable error to inhibit the generation of signals during said write cycle preventing the writing of uncorrectable errors into the cells within said rows and columns specified by said refresh and write address counter means thereby preserving original uncorrectable error conditions within said cells.

27. The system of claim 24 wherein said number of arrays is organized into at least a pair of memory module units, each including a plurality of word storage locations, said write address counter means including a pair of series connected bistable means coupled to said addressing means, said pair of series connected bistable means generating signals for conditioning said addressing means to access all of said memory cells of a pair of storage locations within said pair of memory module units during each said rewrite cycle of operation.

28. The system of claim 24 wherein said system further includes initialize control means coupled to said timing and control means, said refresh counter means, said addressing means and said write address counter means, said initialize control means being operative in response to a signal indicative of power being applied to said memory system to condition said timing and control means in response to each refresh command signal to generate signals for applying to said number of arrays to perform a refresh cycle followed by a write cycle upon said cells having the row and column addresses specified by the contents of said refresh counter means and said write address counter means respectively until all of said cells of said number of arrays have predetermined data written therein.

29. A dynamic semiconductor memory system comprising:
at least a pair of memory module units, each unit including a plurality of rows of MOS memory chips, each chip including a number of arrays of memory cells organized into a plurality of storage locations including a number of rows and columns;
error detection and correction circuit means coupled to said pair of memory module units for detecting and correcting single bit errors in the contents of the cells read out from said memory module units during a memory cycle of operation;
addressing means for applying addresses to said plurality of rows of chips during said memory cycle of operation;
timing control means for providing sequences of timing signals for performing said memory cycle of operation;
refresh control means for generating a refresh command signal for refreshing the memory cells within a row of said arrays of said plurality of rows of chips of each of said memory module units during each one of a plurality of evenly distributed refresh cycles of operation, said refresh control means being coupled to said addressing means and to said timing control means, said refresh control means including a refresh address counter for sequentially counting through all of the row addresses required to refresh all of said cells of said memory module units;
a write address counter connected in series with said refresh address counter and to said addressing means, said write address counter for sequentially counting through all of the column addresses required to write data into all of said cells of said memory module units; and,
rewrite control means coupled to said refresh control means, said addressing means and to said timing control means, said rewrite control means including a counter having a predetermined number of stages for generating a predetermined maximum count, said counter being operative upon generating a count corresponding to a predetermined number of refresh command signals to condition said timing control means to initiate a rewrite cycle of operation during which said timing control means generates a sequence of signals for performing read and write cycles of operations upon said cells in a row of chips of each of said memory module units within the rows and columns of one of said plurality of storage locations specified by said refresh address counter and write address counter respectively for enabling the detection and correction of said single bit errors within said pair of memory module units by said error detection and correction means at a predetermined rate which is less than the rate for refreshing said cells and is sufficient to render said system less susceptible to soft errors.

30. The system according to claim 29 wherein said rewrite control means includes decode circuit means coupled to said counter means, said decode circuit means being operative in response to signals from said counter indicating said occurrence of said predetermined number of refresh command signals to generate a rewrite command signal for resetting said counter and for initiating said rewrite cycle of operation.

31. The system of claim 30 wherein said decode circuit means is connected to said counter to cause the generation of said rewrite command signal in accordance with a modulus which is one less than the maximum count value generated by said counter.

32. The system of claim 31 wherein said counter includes a number of stages and said modulus equal $2^n - 1$ wherein n corresponds to said number of stages.

33. The system of claim 32 wherein n is selected to have a value for detecting and correcting any single bit errors within all of said cells of said memory module units and said predetermined rate is selected to minimize interference with normal memory operations.

34. The system of claim 33 wherein n equals 11, said modulus equals 2047 and said predetermined rate equals 0.03 seconds.

35. The system of claim 31 wherein said modulus is selected for generating said rewrite command signal when said refresh address counter and said write counter store a different row address and column address respectively enabling all possible combinations of said row and column addresses to be generated.

36. The system of claim 35 wherein said all combinations of said row and column addresses are generated in a predetermined non-consecutive order.

37. The system of claim 30 wherein said rewrite control means further includes cycle phase control means for generating signals defining the different cycles of said rewrite cycle of operation and wherein said memory system further includes read/write command control means coupled to said timing control means, said refresh control means, said rewrite control means and to said pair of memory module units, said cycle phase control means including a plurality of series connected bistable means for generating said signals in a predetermined sequence for conditioning said timing control means and said read/write command control means to perform in sequence read and write cycles of operation upon said different one of said cells within said rows and columns of said one of said number of storage locations specified by said contents of said refresh address counter and said write address counter respectively.

38. The system of claim 37 wherein said read and write cycles of operation include a refresh cycle of operation.

39. The system of claim 37 wherein said read/write command control means further includes write abort control means coupled to said error detection and correction means, said abort control means being conditioned by signals from said error detection and correction means indicative of an uncorrectable error in the contents read out from said memory module units during said read cycle of operation to inhibit said write cycle preventing the writing of uncorrectable errors into the cells within said rows and columns specified by said refresh and write address counters thereby preserving original uncorrectable error conditions within said memory module units.

40. The system of claim 37 wherein said system further includes initialize control means coupled to said timing control means, said refresh counter, said address means and said write address counter, said initialize control means being operative in response to a signal indicative of power being applied to said memory system to condition said timing control means in response to each refresh command signal to generate signals for applying to said plurality of rows of chips to perform a refresh cycle followed by a write cycle upon said cells within said plurality of rows of chips having the row and column addresses specified by the contents of said refresh counter and said write address counter respectively until all of said cells of all of said number of arrays have predetermined data written therein.

* * * * *